(12) United States Patent
Niiyama et al.

(10) Patent No.: US 7,855,155 B2
(45) Date of Patent: Dec. 21, 2010

(54) PROCESS FOR PRODUCING SEMICONDUCTOR DEVICE USING OPTICAL ABSORPTION LAYER

(75) Inventors: Yuki Niiyama, Tokyo (JP); Hiroshi Kambayashi, Tokyo (JP); Takehiko Nomura, Tokyo (JP); Seikoh Yoshida, Tokyo (JP); Masatoshi Ikeda, legal representative, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 19 days.

(21) Appl. No.: 12/382,942

(22) Filed: Mar. 26, 2009

(65) Prior Publication Data
US 2009/0325339 A1    Dec. 31, 2009

(30) Foreign Application Priority Data
Mar. 28, 2008    (JP) .............................. 2008-088602

(51) Int. Cl.
*H01L 21/26* (2006.01)
(52) U.S. Cl. ..................................... 438/795
(58) Field of Classification Search ........................ None
See application file for complete search history.

(56) References Cited

U.S. PATENT DOCUMENTS 4,154,625 A * 5/1979 Golovchenko et al. ........ 438/45
5,285,078 A * 2/1994 Mimura et al. ................. 257/3
2005/0124129 A1* 6/2005 Ito .............................. 438/308

FOREIGN PATENT DOCUMENTS

JP    2000-174034    6/2000

OTHER PUBLICATIONS

Y. Irokawa et al., "Implantation temperature dependence of Si activation in AlGaN," Appl. Phys. Lett. 88 (2006) 182106.
S. Matsunaga et al., "Silicon implantation in epitaxial GaN layers: Encapsulant annealing and electrical properties," J. Appl. Phys. 95 (2004) 2461.
J. A. Fellows, "Electrical activation studies of GaN implanted with Si from low to high dose," Appl. Phys. Lett. 80 (2002) 1930.

* cited by examiner

*Primary Examiner*—Scott B Geyer
(74) *Attorney, Agent, or Firm*—Kubotera & Associates, LLC

(57) ABSTRACT

An optical absorption layer comprised of a substance having a band gap energy smaller than that of GaN is formed on an implanted region formed in a pGaN layer as a ground layer. There is performed an annealing step from an upper surface of a substrate with predetermined light such as infrared light, a red light, or the like, which has energy smaller than the band gap energy of the pGaN layer. The optical absorption layer has an absorption coefficient of the light in the annealing step larger than that of the pGaN layer. Accordingly, it is possible to selectively perform a heat treatment on a region directly under the optical absorption layer or a region in a vicinity thereof (the implanted region).

15 Claims, 14 Drawing Sheets

PROCESS FOR PRODUCING SEMICONDUCTOR DEVICE USING OPTICAL ABSORPTION LAYER

CROSS REFERENCE TO RELATED APPLICATIONS

This application claims priority from a Japanese application No. 2008-088602 filed on Mar. 28, 2008, the entire content of which is incorporated herein by reference.

BACKGROUND OF THE INVENTION

1. Field of the Invention

The present invention relates to a process for producing a semiconductor device, and more specifically to the process for producing the semiconductor device, with making use of a semiconductor of a III group nitride compound.

2. Description of the Background Art

In recent years, there is developed a semiconductor device with making use of a semiconductor of a III group nitride compound, for an object of such as an operation thereof to be speed up, a stable operation thereof under an environment at a high temperature, or the like (refer to a patent document 1 as mentioned below for example). Moreover, as such the semiconductor of the III group nitride compound, there are used such as gallium nitride (GaN), aluminum nitride (AlN), indium nitride (InN), or the like.

Further, in a case of producing such as a MOSFET (metal oxide semiconductor field effect transistor), with making use of the semiconductor of the III group nitride compound, it becomes required a process to activate an impurity, for such the impurity to function as a dopant, which is implanted into such as a source region, a drain region, or the like, regarding a semiconductor layer (refer to nonpatent documents 1 to 3 as mentioned below for example). Furthermore, for such the process, there is made use of an annealing process therefore with making use of such as an electric furnace, an RTA (a rapid thermal anneal) equipment, or the like in general.

As describing more specifically, at first an impurity, such as Si ion or the like, is implanted into a predetermined region regarding the semiconductor layer of the III group nitride compound, which is grown on a substrate, and then a film layer for coating such the semiconductor layer is formed by accumulating such as a dielectric film layer or the like over a whole surface for a device formation. Moreover, as a substance to be accumulated thereon in such the case thereof, it is able to make use of such as silicon oxide ($SiO_2$), silicon nitride (SiN), aluminum nitride (AlN), or the like. Further, as a method for accumulating thereof, it is able to make use of such as a spattering method or the like. Next, the impurities becomes to be activated (the annealing process), which is implanted into the semiconductor layer of the III group nitride compound, which exists as an upper layer on the substrate, by performing a light irradiation process in a predetermined period of time for the substrate via such the film layer to be accumulated thereon. Furthermore, such the film layer to be accumulated thereby as mentioned above becomes to function as a prevention film layer for suppressing a number of N atoms to be come off from the semiconductor layer of the III group nitride compound in the period of such the annealing process.

[Patent Document 1] Japanese Patent Application Publication No. 2000-174034

[Nonpatent Document 1] Y. Irokawa et al., "Implantation temperature dependence of Si activation in AlGaN," Appl. Phys. Lett. 88 (2006) 182106.

[Nonpatent Document 2] S. Matsunaga et al., "Silicon implantation in epitaxial GaN layers: Encapsulant annealing and electrical properties," J. Appl. Phys. 95 (2004) 2461.

[Nonpatent Document 3] J. A. Fellows, "Electrical activation studies of GaN implanted with Si from low to high dose," Appl. Phys. Lett. 80 (2002) 1930.

Here, a light to be made use regarding a general thermal treatment equipment is an infrared light, which has a wavelength as approximately between 0.6 μm and 1.0 μm. On the contrary, a band gap energy of the semiconductor layer to be formed with making use of the semiconductor of the III group nitride compound is larger than an energy of the above mentioned infrared light in general. Hence, according to an annealing step with making use of the infrared light, such the semiconductor layer to be formed with making use of the semiconductor of the III group nitride compound cannot help but function as a transparent film for the above mentioned infrared light. And then it becomes unable to perform a heat treatment directly for the impurity to be implanted into the semiconductor layer of the III group nitride compound.

For example, in a case where a GaN film layer is made use as the semiconductor layer of the III group nitride compound, a wavelength of a light, that the GaN layer adsorbs, is not longer than 365 nm approximately, due to the band gap energy of GaN as 3.4 eV. Hence, such the GaN film layer cannot help but function as a transparent film for the infrared light.

Thus, according to the above mentioned reasons, there is performed the heat treatment for the impurity to be implanted into the semiconductor layer as conventional, by heating up with making use of the light of such as the infrared light or the like for irradiating such as the substrate, a sample plate, or the like, via the semiconductor layer, that functions as the hyaline film layer, and then by raising temperature of such the semiconductor layer with making use of a conduction of heat therefrom.

However, according to such the method as described above to activate the impurity to be implanted into the semiconductor layer with making use of the conduction of heat from such as the substrate, the sample holder, or the like, it is required an excessively high temperature for the substrate. In particular for a configuration that the impurity is implanted into the layer to be spaced from such as the substrate, the sample holder, or the like, such as the MOSFET or the like, it becomes necessary to be the temperature for such the substrate as further higher for activating such the impurity.

And then in the case of setting the temperature for such the substrate in such the way, there are occurred problems, such as that atoms in a crystal thereof may become to be aggregated out on a surface of the semiconductor layer, that a crystalline defect may become to be formed on the surface of the semiconductor layer, which is called as a pit, or the like. Moreover, as the case may be, there are occurred further problems, such as that the semiconductor layer may become to be cracked, that a partial peeling off may become to be happened at between the semiconductor layer and the substrate, or the like.

Further, regarding the above mentioned problems, the aggregated atoms the atoms that constitute the semiconductor and the formation of the pit cannot help but occur even in a region where there is not any impurities to be implanted at all. Hence, in a case of fabricating the MOSFET by making use of the above mentioned conventional techniques for example, there are occurred problems, such as that a channel mobility would be decreased, that a withstand property thereof cannot help but become to be deteriorated thereby, or the like. Still further, in a case of fabricating the HEMTs (high electron mobility transistors), there becomes occurred another problem that a density of a two dimensional electron gas therein cannot help but become to be decreased thereby. Furthermore, in a case of producing a semiconductor laser, there becomes occurred another problem that an intermixing diffusion of the constitutive atoms or the impurities therein cannot help but become to be happened between a dielectric passivation layer and the semiconductor layer thereby.

Here, it is necessary to avoid such the above mentioned problems as much as possible, because of becoming a factor to decrease such as a performance, a reliability, or the like, regarding such a device. Moreover, it is not able to form a semiconductor device from the beginning thereof, in a case where any crack is generated therein, any partial peeling off is occurred therein, or the like.

SUMMARY OF THE INVENTION

Here, the present invention has been made to overcome with having regard to such the above mentioned conventional problems, and it is an object of the present invention to provide a process for producing a semiconductor device, wherein it becomes able to perform a heat treatment for an impurity to be implanted thereinto, without deteriorating a performance or a reliability of the device.

For solving the above mentioned subjects and for achieving the object thereof, a process for producing a semiconductor device according to the present invention is characterized in that the process for producing the semiconductor device comprises the steps of: forming an optical absorption layer comprised of a substance having a band gap energy as smaller than a band gap energy of a semiconductor of a III group nitride compound on an impurity implanted region regarding a substrate as a processing object comprising a semiconductor layer comprised of the semiconductor of the III group nitride compound that the impurity implanted region is formed therein, as an optical absorption layer formation process; and activating the impurity in the impurity implanted region by performing an annealing process for the substrate as the processing object with making use of a predetermined light to be irradiated onto the substrate, which has an energy as smaller than the band gap energy of the semiconductor of the III group nitride compound, as an annealing process.

Moreover, the process for producing the semiconductor device according to the present invention is characterized in that regarding the above mentioned invention the band gap energy of the optical absorption layer is not higher than energy of the predetermined light.

Further, the process for producing the semiconductor device according to the present invention is characterized in that regarding the above mentioned invention the optical absorption layer is a dielectric layer.

Still further, the process for producing the semiconductor device according to the present invention is characterized in that regarding the above mentioned invention the predetermined light has a wavelength as not shorter than 0.6 μm but not longer than 1.0 μm.

Still further, the process for producing the semiconductor device according to the present invention is characterized in that regarding the above mentioned invention the band gap energy of the optical absorption layer is not higher than 1.2 eV.

Still further, the process for producing the semiconductor device according to the present invention is characterized in that regarding the above mentioned invention the optical absorption layer is a film layer to be formed with making use of any one of Ge, DLC, and a-Si.

Still further, the process for producing the semiconductor device according to the present invention is characterized in that regarding the above mentioned invention the semiconductor layer is a layer to be configured with making use of any one of GaN, AlGaN, BGaN, BAlN, InGaN, AlN, and InN.

Still further, the process for producing the semiconductor device according to the present invention is characterized in that regarding the above mentioned invention the process for producing the semiconductor device comprises the additional step of: forming a prevention film layer for preventing from desorbing a nitride atom regarding the semiconductor layer, by coating an upper surface of the semiconductor layer and the optical absorption layer formed on the semiconductor layer, as a prevention film layer formation process.

Still further, the process for producing the semiconductor device according to the present invention is characterized in that regarding the above mentioned invention the process for producing the semiconductor device comprises the additional step of: forming a prevention film layer for preventing from diffusing a nitride atom regarding the semiconductor layer, by coating an upper surface of the semiconductor layer, as a prevention film layer formation process, wherein the optical absorption film layer is formed on the prevention film layer.

Still further, the process for producing the semiconductor device according to the present invention is characterized in that regarding the above mentioned invention the process for producing the semiconductor device comprises the additional steps of: forming a gate insulator on the semiconductor layer, as a gate insulator formation process; and forming a gate electrode on the gate insulator, as a gate electrode formation process, wherein the impurity implanted region is formed at a first region as at least two regions thereof regarding the semiconductor layer.

Still further, the process for producing the semiconductor device according to the present invention is characterized in that regarding the above mentioned invention the impurity implanted region is individually formed at the first region as two regions thereof and at a second region, which is a region regarding the semiconductor layer, the same is sandwiched between the first region as two regions thereof, and the same is in contact with either one of the first region as two regions thereof.

Still further, the process for producing the semiconductor device according to the present invention is characterized in that regarding the above mentioned invention the semiconductor layer comprises a first semiconductor layer, which is formed with making use of a nitride compound semiconductor of a III group nitride compound, and a second semiconductor layer, which is formed at a part on the first semiconductor layer with making use of a semiconductor of a III group nitride compound, the impurity implanted region is individually formed at the part on the first semiconductor layer, that the second semiconductor layer is not formed thereat, and at a part of the second semiconductor layer, the gate insulating film layer is formed over the first semiconductor layer and then onto the second semiconductor layer, the gate electrode is formed over the gate insulator on the first semiconductor layer and then onto the gate insulator on the second semiconductor layer, and the impurity implanted region to be formed on the second semiconductor layer is formed at a region to be spaced from a region under the gate electrode.

Still further, the process for producing the semiconductor device according to the present invention is characterized in that regarding the above mentioned invention the semiconductor layer further comprises the first semiconductor layer, which is formed with making use of the semiconductor of the III group nitride compound, the second semiconductor layer, which is formed at the part on the first semiconductor layer with making use of the semiconductor of the III group nitride compound, and a third semiconductor layer, which is formed on the second semiconductor layer, the impurity implanted region is individually formed at the part on the first semiconductor layer, that the second semiconductor layer is not formed thereat, and at a part of the third semiconductor layer, the gate insulating film layer is formed over the first semiconductor layer and then onto the third semiconductor layer, the gate electrode is formed over the gate insulating film layer on the first semiconductor layer and then onto the gate insulating film layer on the third semiconductor layer, and the impurity implanted region to be formed on the third semiconductor layer is formed at a region to be spaced from a region under the gate electrode.

Still further, the process for producing the semiconductor device according to the present invention is characterized in that regarding the above mentioned invention the semiconductor layer further comprises a laminated structure of mesa structure, which is comprised of a lower cladding layer, a lower light guiding layer, an upper light guiding layer on an active layer, and an upper cladding layer, and the impurity implanted region is individually formed at a part of the lower cladding layer and at a part of the upper cladding layer.

Furthermore, the process for producing the semiconductor device according to the present invention is characterized in that regarding the above mentioned invention the substrate as the processing object comprises the semiconductor layer, the mesa structure, which is formed on a first face of the semiconductor layer, and is comprised of the lower cladding layer, the lower light guiding layer, the upper light guiding layer on the active layer, and the upper cladding layer, the impurity implanted region is formed at a second face side as an opposite side against the first face of the semiconductor layer, and the annealing process comprises the additional step of irradiating the predetermined light onto the substrate as the processing object from the second face side thereof.

Reference symbols used in this application are as follows.
100, 200, 300 GaN BASED FET
101, 501, 601 SUBSTRATE
102, 502 BUFFER LAYER
103 pGaN LAYER
103a CHANNEL FORMATION REGION
104 n$^+$GaN REGION
104', 204', 508', 509' IMPLANTED REGION
105, 305 GATE INSULATOR
106, 306 GATE ELECTRODE
107 ELECTRODE
204 RESURF REGION
303, 403 n$^-$GaN LAYER
400 GaN BASED HEMT
405 n$^-$AlGaN LAYER
500, 600 GaN BASED SEMICONDUCTOR LASER
503 LOWER CLADDING LAYER
504 LOWER OPTICAL CONFINEMENT LAYER
504A LOWER LAYER unGaN FILM
505 ACTIVE LAYER
505A unInGaN FILM LAYER
506 UPPER OPTICAL CONFINEMENT LAYER
506A UPPER LAYER unGaN FILM
507 UPPER CLADDING LAYER
507A pAlGaN FILM LAYER
508 n$^+$ DIFFUSION REGION
509 p$^+$ DIFFUSION REGION
510 n-TYPE ELECTRODE
511 p-TYPE ELECTRODE
R1 PHOTO RESIST
M1, M21, M31, M34, M51, M53, M55, M62 MASK OXIDE FILM LAYER
M2, M22, M32, M52, M54, M63 OVERCOAT FILM LAYER
M3, M3', M56, M65 PREVENTION FILM LAYER
T1, T1', T2, T3, T6, T51, T52 ABSORPTION LAYER

DETAILED DESCRIPTION OF THE PREFERRED EMBODIMENTS

Each of embodiments regarding a process for producing a semiconductor device according to the present invention will be described in detail below, with reference to the drawings.

Here, the present invention is not limited by each of such the embodiments. Moreover, each of the drawings just schematically shows a shape, a size and a relationship between each position thereof, for being able to understand just about a content regarding the present invention. Therefore, the present invention is not limited only to the shape, the size and the relationship between the each position thereof as exemplary shown in each of the drawings. Further, regarding each of the drawings, a part of a hatching regarding a cross section is omitted for clarifying a configuration. Furthermore, each of the numerical values to be exemplary shown in the following description is just a preferred example according to the present invention. Therefore, the present invention is not limited to such the numerical values to be exemplary shown therein.

Figure 1:
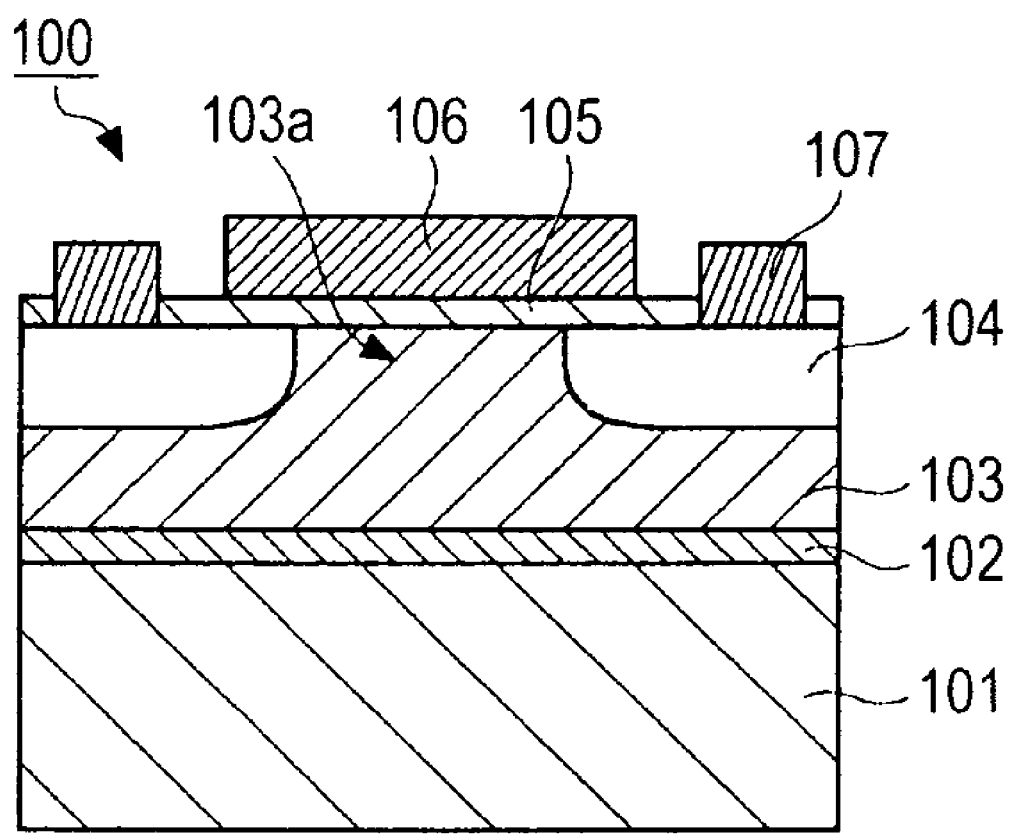
FIG. 1 is a cross sectional drawing showing a configuration of a GaN based FET 100 according to the first embodiment regarding the present invention.

For the first embodiment according to the present invention, there is provided as an example a GaN based FET 100 for a semiconductor device with making use of a semiconductor of a III group nitride compound according to the present invention. FIG. 1 is a cross sectional drawing showing a configuration of the GaN based FET 100 according to the present embodiment. Furthermore, FIG. 1 is the cross sectional drawing in a case of cutting off the GaN based FET 100 in a vertical direction to a substrate and in a parallel direction to a direction of a channel length.

Figure 2A:
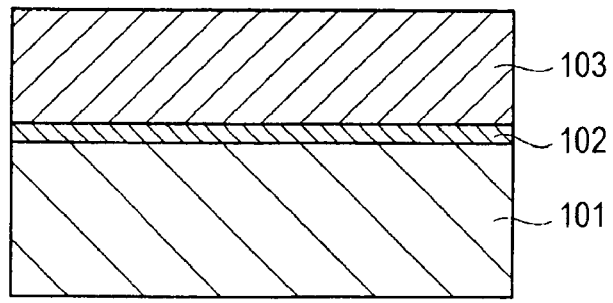
FIGS. 2A to 2C are process charts showing a process (1) for producing the GaN based FET 100 according to the first embodiment regarding the present invention.

Here, regarding a process for producing the GaN based FET 100 according to the first embodiment regarding the present invention, at first an undoped AlGaN layer and an undoped GaN layer is epitaxially grown one after the other onto a substrate 101 as a processing object, by making use of an MOCVD (a metalorganic chemical vapor deposition) method for example. Moreover, in such the case thereof, it is controlled for a film thickness as in total to become approximately 500 nm for example. And then thereby, it becomes able to form a buffer layer 102 (refer to FIG. 2A), which is comprised of the undoped AlGaN/GaN multi-layers. Furthermore, a method of a film formation for such the buffer layer 102 is not limited to the MOCVD method, and it is able to make use of such as an HVPE method (a halide vapor epitaxy), an MBE method (a molecular beam epitaxy method), or the like as well.

And then thereafter, by making use of the MOCVD method as similar thereto, a GaN film layer is epitaxially grown onto the buffer layer 102, that Mg is doped therein. Moreover, in such the case thereof, it is controlled for a film thickness thereof to become as approximately 2.0 μm for example. Further, by controlling a density of Mg in the GaN film layer to become as approximately $1.0 \times 10^{17}$ cm$^{-3}$ (the symbol "×" means a multiplication operator), it becomes able to form a pGaN layer 103 (refer to FIG. 2 (*a*)) in which an impurity of p-type is doped thereinto with a density thereof as relatively lower. Furthermore, it becomes able to make use of such as the HVPE method, the MBE method, or the like, for performing a film formation for such the layer as similar to the above description. And then thereby, it becomes able to obtain a layer structure as shown in FIG. 2 (*a*).

Next, a device separation is performed on a surface of the pGaN layer 103, by performing a photo process, and then by performing a dry etching process with making use of a plasma RIE (an ICP-RIE: inductively coupled plasma reactive ion etching).

Figure 2B:
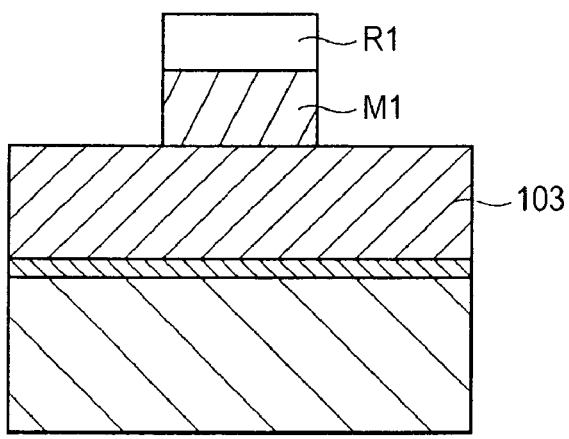

Next, there becomes to be accumulated an SiO2 layer only on an N$^+$ layer for a thickness thereof to become as approximately 1.0 μm, by performing an accumulation process. And then thereby, it becomes able to obtain a layer structure as shown in FIG. 2B.

Figure 2C:
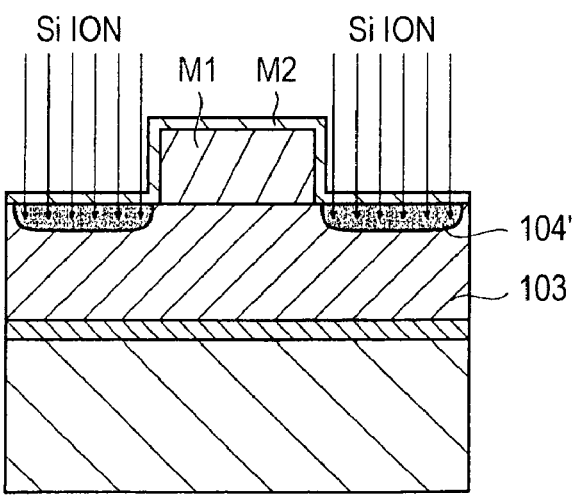

And then thereafter, there becomes to be formed an implanted region 104' at the pGaN layer 103 (an impurity implantation process), by implanting Si ions into the pGaN layer 103, with making use of a mask oxide film M1, by making use of an ion implanter to be existent. And then thereby, it becomes able to obtain a layer structure as shown in FIG. 2C. Furthermore, an amount of a total dose for the Si therein is designed to be as approximately $3 \times 10^{15}$ cm$^{-2}$ (the symbol "×" means a multiplication operator).

Figure 3A:
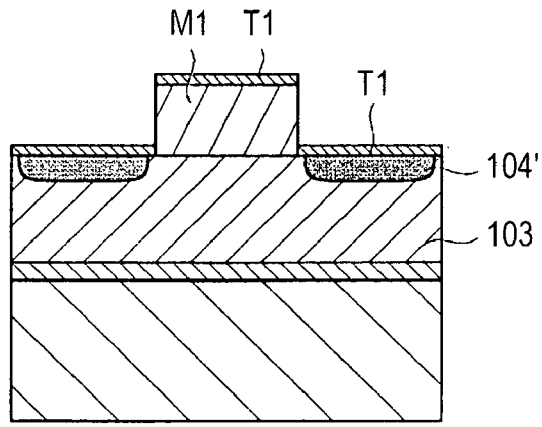
FIGS. 3A to 3C are process charts showing a process (2) for producing the GaN based FET 100 according to the first embodiment regarding the present invention.

And then thereafter, there becomes to be formed an optical absorption layer T1 at directly above the 104' as shown in FIG. 3A, which is comprised of a dielectric film layer, by accumulating a substance onto the implanted region 104' and onto the mask oxide film layer M1, that has a band gap energy as smaller than a predetermined energy (referred to as a narrow band gap energy hereinafter). Moreover, according to the present embodiment, there is made use of germanium (Ge) as the substance, that has the narrow band gap energy, and then there is made use of an electron beam evaporation method for an accumulation thereof. Further, a film thickness of such the substance is designed to be as approximately 30 nm for example. Furthermore, regarding a relation between the predetermined energy and a substance to be made use for the optical absorption layer T1, there will be described in detail in the following description.

And then after there becomes to be formed the optical absorption layer T1 as described above (refer to FIG. 3 (*a*)), next, the mask oxide film layer M1 is removed by performing a wet etching process with making use of an aqueous solution of a hydrofluoric acid based for example. And then thereby there becomes to be remained the optical absorption layer T1, which is formed on a surface of the implanted region 104', meanwhile, the optical absorption layer T1 on the mask oxide film layer M1 is removed by making use of a lift off method (an optical absorption layer formation process).

Figure 3B:
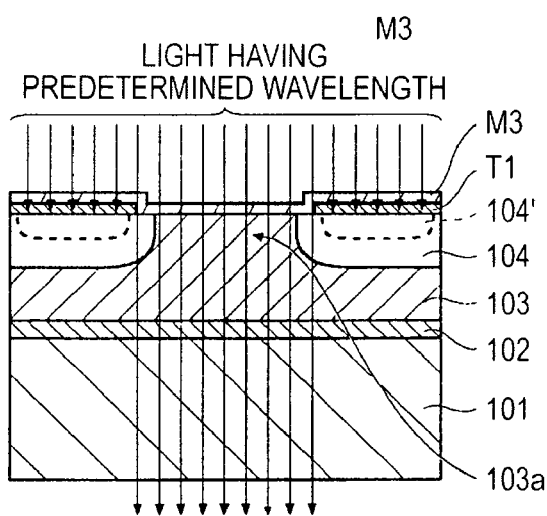
Figure 3C:
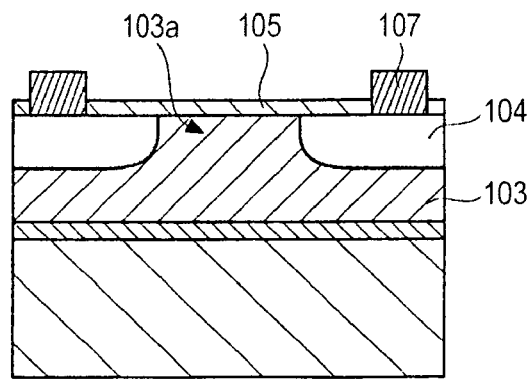
Figure 4:
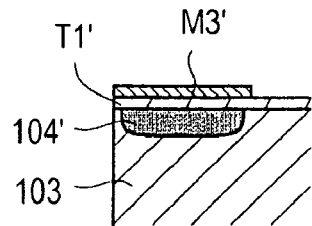
FIG. 4 is a process chart showing modified example of a process for producing the GaN based FET 100 according to the first embodiment regarding the present invention.

And then thereafter, by making use of a reactive spattering method for example, there becomes to be formed a prevention film layer M3 (refer to FIG. 3B, that is comprised of a silicon di-oxide film layer having a film thickness thereof as 500 nm for example, for coating the pGaN layer 103 and the optical absorption layer T1 (a prevention film layer formation process). And then such the prevention film layer M3 becomes to function as a film layer for reducing a number of N atoms to be come off from the pGaN layer 103 in a period of an annealing step as a process thereafter. Moreover, as such the prevention film layer M3, it is able to apply such as a silicon nitride (an SiN) film, an aluminum nitride (AlN) film layer, or the like as well in place of the silicon di-oxide film layer. Furthermore, according to the present embodiment, there is exemplary shown the case where the optical absorption layer T1 is formed onto the implanted region 104' and then the prevention film layer M3 becomes to be formed onto such the layer thereafter. However, the present invention is not limited thereto, and as shown in FIG. 4, it may be available to form a prevention film layer M3' for coating all over a surface of the pGaN layer 103, in which an implanted region 104' is formed, and then it may be available to form an optical absorption layer T1' at a region as an upper side of the implanted region 104' regarding such the prevention film layer M3' thereafter.

And then thereafter, there is performed a heat treatment for the Si (an annealing process), which is implanted into the implanted region 104', by performing an annealing step for the substrate, on which the optical absorption layer T1 is formed, as shown in FIG. 3 (*b*). And then thereby, the Si in the implanted region 104' becomes to be diffused, and the same becomes to be activated and then becomes to function as a dopant. Thus, it becomes able to form thereby an n$^+$GaN region 104 (refer to FIG. 3 (b)). Moreover, a region to be sandwiched between the n+GaN regions 104 (a source and a drain) regarding the p-type semiconductor layer 103 becomes to be a channel formation region 103a therein.

Figure 5:
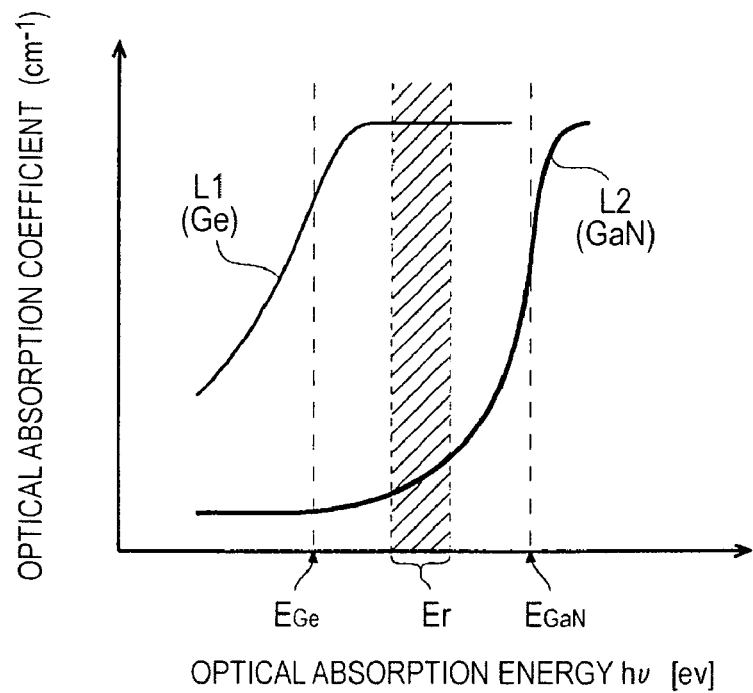
FIG. 5 is a graph showing an optical absorption property regarding GaN and Ge.

Here, the relation between the predetermined energy and the substance to be made use for the optical absorption layer T1 will be described in detail below. According to the present embodiment, the predetermined energy means a band gap energy of a semiconductor of a III group nitride compound; therefore, according to the present embodiment, the same indicates the band gap energy as smaller than 3.4 eV as the band gap energy of GaN. And then by forming the optical absorption layer T1 with making use of the substance, which has such the narrow band gap energy, it becomes possible to design a temperature for the optical absorption layer T1 regarding the following annealing process to be as higher than a temperature for a film layer, which is comprised of the semiconductor of the III group nitride compound (which is the pGaN layer 103 in the case of the present embodiment). This is because that the optical absorption layer T1 absorbs the light further efficiently in a period of the annealing process, and then the temperature thereof becomes to be raised thereby, comparing to the case of the film layer, which is comprised of the semiconductor of the III group nitride compound (the pGaN layer 103). Here, there is shown in FIG. 5 as an example regarding a graph for showing an optical absorption property regarding GaN and Ge. In FIG. 5, an L1 designates a relation curved line (L1) for between a wavelength and an optical absorption coefficient regarding Ge, on the contrary, an L2 designates a relation curved line (L2) for between a wavelength and an optical absorption coefficient regarding GaN. Moreover, as it is obvious from FIG. 5, for a light (the predetermined light), which has an energy as smaller than a band gap energy (an $E_{GaN}$) of a semiconductor of a III group nitride compound (the GaN according to the present example), a substance (the Ge according to the present example), which has a narrow band gap energy (an $E_{Ge}$), has an optical absorption coefficient as larger for the predetermined light. Further, regarding a range Er for a red light or for an infrared light in particular, that has a wavelength of between 0.6 μm and 1.0 μm to be made use for a general annealing equipment, it becomes clear from the same figure that the substance (the Ge) absorbs the light further efficiently and then the temperature thereof becomes to be raised thereby, comparing to the case of the semiconductor of the III group nitride compound (the GaN).

Still further, it is obvious from the above mentioned FIG. 5 as well, it is desirable for the optical absorption layer T1 to be formed with making use of a substrate, which has a band gap energy as smaller than an energy (as approximately between 1.2 eV and 2.0 eV), that corresponds to a wavelength of the above mentioned predetermined light (as approximately between 0.6 μm and 1.0 μm).

Furthermore, according to the present embodiment, there is made use of the GaN as the semiconductor of the III group nitride compound to be made use for the semiconductor layer as a ground layer, however, the present invention is not limited thereto.

Next, the above mentioned annealing process will be described in detail below. According to the present description, there is assumed a general thermal treatment equipment to be made use regarding the above mentioned process to perform the annealing for the impurity (the Si) to be implanted therein, for which the predetermined light is made use, that has the wavelength as approximately between 0.6 μm and 1.0 μm. Moreover, as converting the predetermined light having such the range thereof into energy, it becomes to be as approximately between 1.2 eV and 2 eV. On the contrary, the band gap of the Ge, that is made use for the optical absorption layer T1 according to the present embodiment, is approximately 0.8 eV. Further, as converting the same into a wavelength, it becomes to be approximately as 1.55 μm, and then it becomes to be the wavelength as longer than the above mentioned wavelength of the predetermined light (as approximately between 0.6 μm and 1.0 μm). Thus, by forming the optical absorption layer T1 with making use of the substance, which has the band gap energy as smaller than the energy, that corresponds to the wavelength of the predetermined light to be made use for such the annealing process, it becomes able to configure for the optical absorption layer T1 to absorb further efficiently the predetermined light to be made use for the general thermal treatment equipment, and then for the same to be raised the temperature thereof.

And then as described above, by forming the film (the optical absorption layer T1 and the T1'), that are raised the temperature thereof due to the optical absorption in the period of the annealing step, at a directly upper side of or in a vicinity of the region (the implanted region 104'), that the impurity for performing the heat treatment is implanted thereinto, it becomes possible to perform the heat treatment further efficiently for such the region (the implanted region 104'), that exists at the directly lower side thereof or in the vicinity thereof. As a result, it becomes able to keep a temperature as relatively lower regarding such as the pGaN layer 103, the substrate 101, or the like, except the implanted region 104', and then it becomes possible to avoid from occurring a bad condition, such as that the Ga as the constitutive atom thereof may become to be segregated out on the surface of the pGaN layer 103, that the crystal-line defect may become to be formed on the surface of the pGaN layer 103, which is called as the pit, or the like. Moreover, by making use of the light as the predetermined light in the period of the annealing process, which has the energy as lower than the band gap energy of the semiconductor of the III group nitride compound (the GaN according to the present embodiment), it becomes possible to reduce the absorption of such the predetermined light at the ground layer (the pGaN layer 103), which is formed with making use of the semiconductor of the III group nitride compound. And then this is further effective.

Furthermore, according to the present embodiment, there is provided the Ge film layer as the optical absorption layer T1, however, the present invention is not limited thereto, and it is able to apply such as DLC (diamond like carbon), a-Si (amorphous silicon), or the like. Such the substances have not only the narrow band gap energies individually, but also have the band gap energy as smaller than the energy that corresponds to the wavelength of the predetermined light to be made use for the annealing process. And then it becomes able to obtain the advantages as similar to that in the case where Ge is made use. For example, the band gap energies of DLC and a-Si are determined to be as approximately between 0.8 eV and 3.0 eV, and as approximately 1.1 eV respectively. Hence, regarding an optical absorption layer (T1), which becomes to be formed with making use of either one thereof, it becomes possible to absorb a predetermined light to be made use for an annealing step, and then to be raised a temperature thereof.

Here, after forming the n+GaN region 104 by making use of such the above mentioned technique, next, all of the optical absorption layer T1 and of the prevention film layer M3 are completely removed by performing a wet etching process with making use of an aqueous solution of a hydrofluoric acid based for example.

And then thereafter, by accumulating a silicon oxide layer by making use of a PECVD method for example, there becomes to be formed a gate insulator layer 105 (a gate insulating film layer formation process), which become to have a film thickness as approximately 60 nm for example (refer to FIG. 3C), onto the pGaN layer 103 to be exposed (with including the n$^+$GaN region 104 and the channel formation region 103a).

And then thereafter, by making use of a photography technique and an etching technique for example, there becomes to be formed an open part at the gate insulator 105 for each of the n$^+$GaN regions 104 to be exposed therefrom. And then there becomes to be formed an electrode 107 to be ohmic contacted with the n$^+$GaN region 104 at an inner side of such the open part, wherein the electrode 107 is comprised of a laminated film layer (Ti/Al film layer) with making use of titanium (Ti) and aluminum (Al) for example (refer to FIG. 3 (c)). Thus, it becomes able to obtain a layer structure as shown in FIG. 3 (c).

Next, by making use of an LPCVD (a low pressure CVD) method or the spattering method for example, there becomes to be formed a polysilicon film layer for all over an upper surface of the substrate. And then thereafter, the substrate, on which such the polysilicon film layer is formed, is left at an inside of a thermal diffusion furnace for approximately twenty minutes, in which a POCl$_3$ gas is enclosed. In such the case thereof, a temperature at the inside of the thermal diffusion furnace is set to be as approximately 900° C. Hence, there becomes to be doped phosphorus (P) as an impurity into the polysilicon film layer thereby, and then it becomes able for such the polysilicon film layer to function as a n-type conductor film layer. Furthermore, as a doping method for the polysilicon film layer to be made use for a gate electrode 106, it is possible to modify in a various manners, such as that phosphorous (P) is evaporated onto the polysilicon film layer, and then that the same becomes to be doped into the polysilicon film layer by performing the thermal diffusion, or the like, in place of making use of the above mentioned technique.

And then thereafter, by performing a spin coating process with making use of a photo resist solution onto such the polysilicon film layer, and then by performing an exposure process and a development process, there becomes to be formed a photo resist to coat an upper side of the channel formation region 103a. And then thereafter, by performing an anisotropic etching process for the polysilicon film layer with making use of such the photo resist as a mask, it becomes able to shape the polysilicon film layer to become as the gate electrode 106 (a gate electrode formation process). And then thereby, it becomes able to form the GaN based FET 100, that has a cross sectional structure as shown in FIG. 1.

As described above, according to the present embodiment, there is described with providing the example as in the case where the film layer (the optical absorption layer T1) for increasing the temperature thereof with making use of the optical absorption is formed directly at the upper side of the region (the implanted region 104'), in which the impurity to be required for performing the heat treatment is implanted. However, the present invention is not limited thereto, and it becomes able to obtain the advantages as similar thereto if a film layer for raising the temperature thereof with making use of the optical absorption is formed in a vicinity of the region, in which the impurity to be required for performing the heat treatment is implanted. Moreover, according to the present embodiment, there is described with providing the example as the MOSFET (nMOSFET), in which the channel of n-type is formed. However, the present invention is not limited thereto, and it becomes applicable to a case of another MOSFET (a pMOSFET), in which another channel as a p-type is formed. Further, it becomes applicable to a case where the nMOSFET and the pMOSFET are formed onto a similar substrate as well. Furthermore, even in such the case thereof, according to the present invention, it becomes possible to diffuse and to activate the impurities as the p-type and as the n-type individually by making use of the annealing step as only one time.

Next, as a semiconductor device with making use of a semiconductor of a III group nitride compound according to the second embodiment regarding the present invention, there is provided a GaN based FET 200 as one example, and then a configuration thereof and a process for producing the same will be described in detail below, with reference to the drawings. Moreover, according to the description as below, a detailed description regarding a configuration as similar to that according to the first embodiment will be omitted with making use of the similar symbol. Furthermore, regarding a matter as not to be mentioned specially therein, it is similar to that according to the first embodiment.

Figure 6:
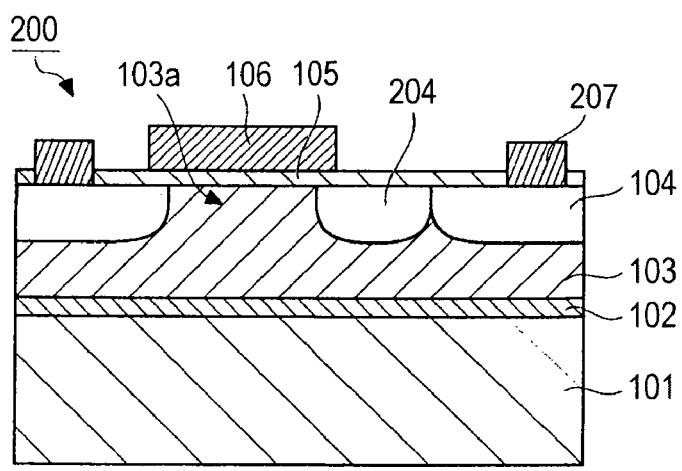
FIG. 6 is a cross sectional drawing showing a configuration of a GaN based FET 200 according to the second embodiment regarding the present invention.

FIG. 6 is a cross sectional drawing showing the configuration of the GaN based FET 200 according to the present embodiment. Moreover, FIG. 6 is the cross sectional drawing in a case of cutting off the GaN based FET 200 in a vertical direction to a substrate and in a parallel direction to a direction of a channel length, as similar to that as shown in FIG. 1.

As it is obvious with comparing between FIG. 6 and FIG. 1, regarding the GaN based FET 200 according to the present embodiment, for the embodiment as similar to the GaN based FET 100 according to the first embodiment regarding the present invention, a RESURF (a reduced surface field) region 204 becomes to be added at a drain side regarding an upper layer part of the pGaN layer 103, and then the n$^+$GaN region 104 at the drain side thereof is spaced from a lower side of the gate electrode 106 therein. Thus, according to such the configuration thereof, by making use of such the GaN based FET 200, it becomes able to realize the GaN based FET 200 as the same is designed to become withstanding as further higher than the GaN based FET 100 according to the first embodiment regarding the present invention.

Moreover, such the RESURF region 204 is an n$^-$ diffusion region, in which an impurity of n-type is doped with a density thereof as lower than that in the n$^+$GaN region 104 for example. Further, according to the present embodiment, it is designed to be adopted Si ion as the impurity of n-type, as similar to that for the n$^+$GaN region 104. However, the present invention is not limited thereto, and it is able to apply thereto such as Ge, Se, Te, or the like as well. Furthermore, all the other configurations are similar to that according to the first embodiment regarding the present invention, and then a detailed description will be omitted hereinafter.

Figure 7A:
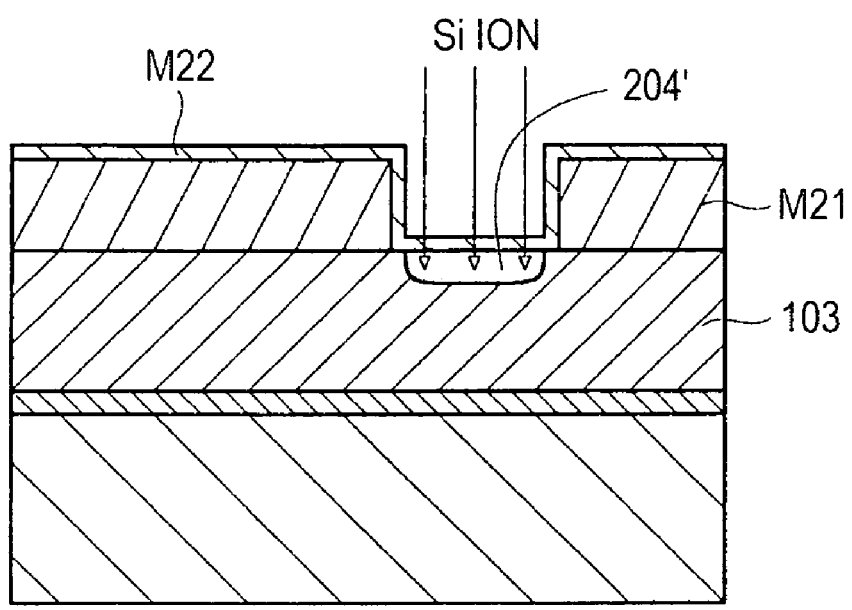
FIGS. 7A and 7B are process charts showing a process for producing the GaN based FET 200 according to the second embodiment regarding the present invention.
Figure 7B:
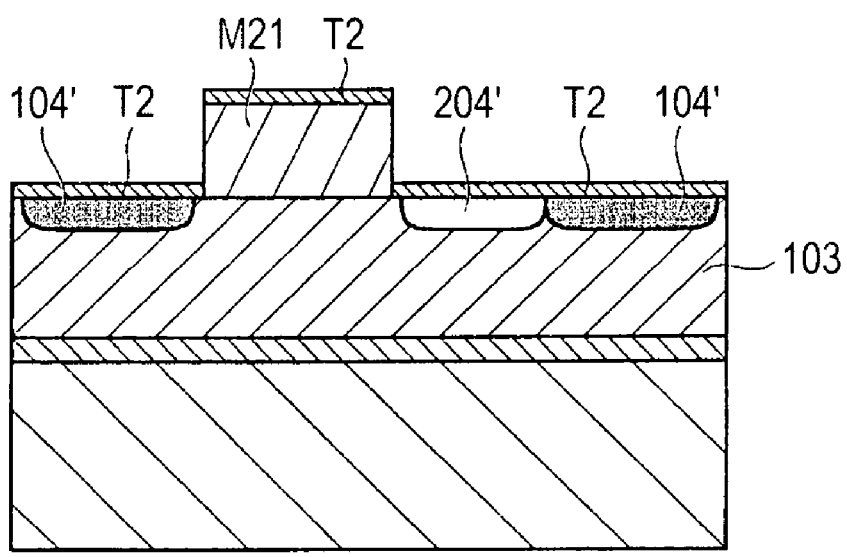

Next, a process for producing the GaN based FET 200 according to the present embodiment will be described in detail below, with making use of the drawings. Moreover, regarding a process as similar to the process as described in the first embodiment according to the present invention, a detailed description will be omitted by referring to such the description therefrom. Further, FIGS. 7A and 7B are cross sectional drawings individually showing a process for producing the GaN based FET 200 according to the present embodiment, wherein each of the cross sections thereof individually corresponds to the cross section as shown in FIG. 6.

Here, according to the process for producing the GaN based FET 200 regarding the present embodiment, at first there is formed such a structure on a substrate as shown in FIG. 2 (b) by performing the process as similar to that according to the first embodiment regarding the present invention. And then thereafter, by making use of the PECVD method for example, there becomes to be formed a silicon di-oxide film layer onto the pGaN layer 103, which becomes to have a film thickness as approximately 1000 nm.

And then thereafter, by performing a photo process, there becomes to be formed an SiO$_2$ mask, that has a film thickness as approximately 1 μm, and that a part thereof at a side right above the RESURF region becomes to be opened thereby. Moreover, there becomes to be formed an implanted region 204' (a first impurity implanted region) at a predetermined region (a first region) at a drain side thereof, by implanting Si ions into the pGaN layer 103, with making use of a mask oxide film layer M21, and by making use of an ion implantation equipment to be existent, as shown in FIG. 7 (a) (a first impurity implantation process). Furthermore, a condition for the ion implantation in such the case thereof, it is able to design an amount of a dose to be as approximately $6.0 \times 10^{13}$ cm$^{-2}$ for example (the symbol "×" means a multiplication operator), and it is able to design acceleration energy to be as approximately 45 keV for example.

Next, all of the mask oxide film layer M21 and of an overcoat film layer M22 are completely removed by performing a wet etching process with making use of an aqueous solution of a hydrofluoric acid based for example. And then thereafter, there becomes to be formed an implanted region 104' (a second impurity implanted region) individually at each of predetermined regions (a second regions) at a drain side thereof and at a source side thereof (a second impurity implantation process), by performing a process as similar to the process as described with reference to FIG. 2 (c) regarding the first embodiment according to the present invention. Moreover, in such the case thereof, the implanted region 104' at the drain side thereof may be superimposed on the implanted region 204' as well.

And then thereafter, by accumulating a substance, which has a narrow band gap, onto the implanted region 104' and the 204', and onto the mask oxide film layer M21, there becomes to be formed an optical absorption layer T2, which becomes to have a film thickness as approximately 30 nm, as shown in FIG. 7 (b). Moreover, according to the present embodiment, as similar to that according to the first embodiment regarding the present invention, there is used Ge as the substance as well, which has the narrow band gap, and then there is made use of the electron beam evaporation method for the accumulation of such the substance. However, the present invention is not limited thereto, and it is able to apply such as DLC, a-Si, or the like as well, as similar to that according to the first embodiment regarding the present invention.

Next, by performing a process as similar to the process as described with reference to FIG. 3 (b) regarding the first embodiment according to the present invention, the optical absorption layer T2 on the mask oxide film layer M21 is removed by making use of the lift off method, and then thereafter there becomes to be formed a prevention film layer M3 for all over an upper surface of the substrate. Moreover, there is performed an annealing thereafter for the Si (an optical absorption layer formation process, an annealing process), which is implanted into the implanted region 104' and the 204'. Hence, there becomes to be diffused thereby the Si in the implanted region 104' and the 204', and then the same becomes to be activated and to function as a dopant as well. Thus, there becomes to be formed thereby the n$^+$GaN region 104 and the RESURF region 204. Furthermore, there may become to be formed the optical absorption layer T2 on the prevention film layer M3 as well.

And then thereafter, by performing a process as similar to the process as described with reference to FIG. 3 (c) regarding the first embodiment according to the present invention, there is performed a removing process for the optical absorption layer T2 and for the prevention film layer 3, and then there becomes to be formed a gate insulator layer 105, an electrode 107 and a gate electrode 106 (a gate insulating film layer formation process, a gate electrode formation process). And then thereby, there becomes to be produced the GaN based FET 200, which become to have a cross sectional structure as shown in FIG. 6. Furthermore, according to the present embodiment, it is possible to modify in a various manners as well, as similar to that according to the first embodiment regarding the present invention.

Next, as a semiconductor device with making use of a semiconductor of a III group nitride compound according to the third embodiment regarding the present invention, there is provided a GaN based FET 300 as one example, and then a configuration thereof and a process for producing the same will be described in detail below, with reference to the drawings. Moreover, according to the description as below, a detailed description regarding a configuration as similar to that according to the first or the second embodiment will be omitted with making use of the similar symbol. Furthermore, regarding a matter as not to be mentioned specially therein, it is similar to that according to the first or the second embodiment.

Figure 8:
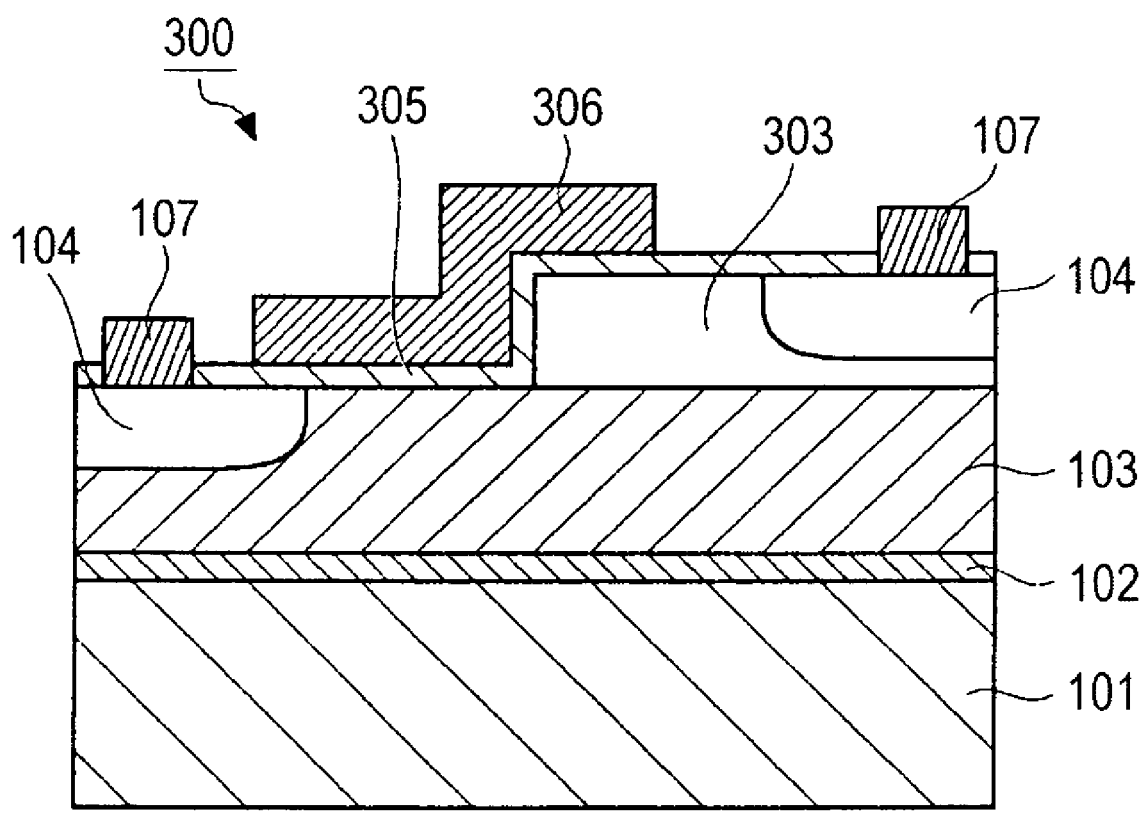
FIG. 8 is a cross sectional drawing showing a configuration of a GaN based FET 300 according to the third embodiment regarding the present invention.

FIG. 8 is a cross sectional drawing showing the configuration of the GaN based FET 300 according to the present embodiment. Moreover, FIG. 8 is the cross sectional drawing in a case of cutting off the GaN based FET 300 in a vertical direction to a substrate and in a parallel direction to a direction of a channel length, as similar to that as shown in FIG. 1.

As it is obvious with comparing between FIG. 8 and FIG. 1, regarding the GaN based FET 300 according to the present embodiment, for the embodiment as similar to the GaN based FET 100 according to the first embodiment regarding the present invention, an n$^-$GaN layer 303 becomes to be added at a drain side for coating the surface of the pGaN layer 103, and then the n$^+$GaN region 104 at the drain side according to the first embodiment regarding the present invention becomes to be formed at an upper layer part of the n$^-$GaN layer 303. Moreover, the gate insulator layer 105 and the gate electrode 106 are replaced to a gate insulator layer 305 and a gate electrode 306, that exist by being extended as from the pGaN layer 103 with passing through a side face of the n$^-$GaN layer 303 and then become reaching to an upper surface thereof.

Further, such the n$^-$GaN layer 303 is the film layer, that has an electro-conductivity of n-type as a small quantity thereof due to a residual donor according to a film formation process, and then the same becomes to function as a similar function to that according to the RESURF region 204, that is described in the second embodiment according to the present invention. That is to say, according to the GaN based FET 300 regarding the present embodiment, it becomes able to realize for the same to become withstanding as further higher. Still further, according to the present invention, it is able to design a film thickness of such the n$^-$GaN layer 303 to be as 130 nm for example. Still further, according to the present embodiment, there is applied the GaN as the semiconductor of the III group nitride compound, however, the present invention is not limited thereto, and it is able to make use of a semiconductor of a nitride compound as well, that contains at least one as an element of the III group from Al, Ga, In and B, such as AlGaN, BGaN, BAlN, InGaN, AlN, InN, or the like.

Still further, it becomes to have a configuration that the gate insulator layer 305 and the gate electrode 306 are formed at right above the pGaN layer 103 for the source side thereof, and that the same become to exist by being extended as passing through the side face of the n$^-$GaN layer 303 regarding the drain side thereof and then become reaching to the upper surface thereof. Furthermore, all the other configuration are similar to that according to the first or the second embodiment, and then the detailed descriptions will be omitted hereinafter.

Figure 9A:
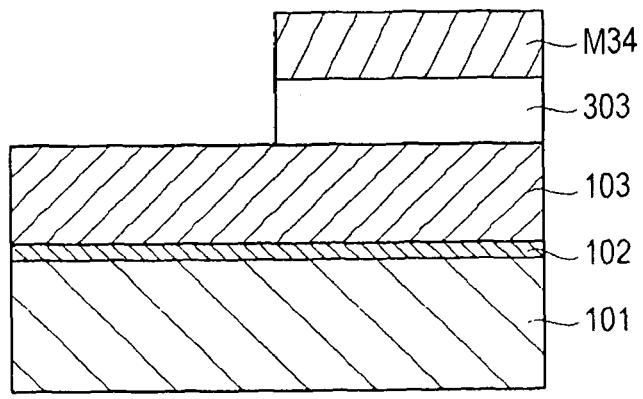
FIGS. 9A to 9C are process charts showing a process for producing the GaN based FET 300 according to the third embodiment regarding the present invention.
Figure 9B:
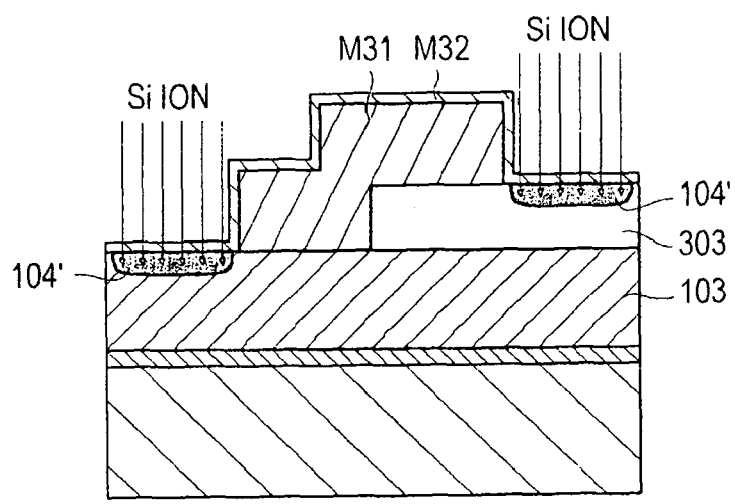

Next, a process for producing the GaN based FET 300 according to the present embodiment will be described in detail below, with making use of the drawings. Moreover, regarding a process as similar to the process as described in the first or the second embodiment according to the present invention, a detailed description will be omitted by referring to such the description therefrom. Further, FIGS. 9A and 9B are cross sectional drawings individually showing a process for producing the GaN based FET 300 according to the present embodiment, wherein each of the cross sections thereof individually corresponds to the cross section as shown in FIG. 8.

Here, according to the process for producing the GaN based FET 300 regarding the present embodiment, at first there is formed a substrate of layer structure as shown in FIG. 2 (b) by performing a process as similar to that according to the first embodiment regarding the present invention. And then thereafter, by making use of the MOCVD method for example, there becomes to be epitaxial grown a GaN film layer onto the pGaN layer 103, which becomes to have the film thickness as approximately 130 nm. Moreover, there is not made use of any dopant at all in a period of such the process, however, the GaN film layer to be grown thereon has an electro-conductivity of n-type as a small quantity thereof due to a residual donor therein according to the film formation process. Furthermore, it is able to make use of such as the HVPE method, the MBE method, or the like as well for performing the film formation of such the GaN film layer.

And then thereafter, by performing a spin coating process with making use of a photo resist solution onto a surface of such the GaN film layer, and then by performing an exposure process and a development process, there becomes to be formed a photo resist, that an open part thereof becomes to be formed along a device separation region therein. And then thereafter, by performing an anisotropic etching process for the GaN film layer and the pGaN layer 103 with making use of such the photo resist as a mask, there becomes to be formed a trench (not shown in the figures), which has a depth as approximately 200 nm from the surface of the GaN film layer for example. And then thereby, the upper layer of the pGaN layer 103 becomes to be separated into device formation regions as not less than one piece (a device separation). Moreover, fur such the anisotropic etching process, it is able to apply a dry etching process for example, by making use of such as the RIE method, the ICP-RIE method, or the like. However, the present invention is not limited thereto, and it is able to apply thereto a variety of techniques for performing the device separation as well. Furthermore, after performing such the etching process, the photo resist becomes to be removed with making use of acetone for example.

And then thereafter, by performing a photo process with making use of an aqueous solution of a hydrofluoric acid based, there becomes to be shaped a mask oxide film layer M34 (refer to FIG. 9 (a)), that becomes to have an open part at a part for a source side thereof.

And then thereafter, such the photo resist becomes to be removed with making use of acetone for example, and then with making use of the mask oxide film layer M34 thereafter, the GaN film layer and then the pGaN layer 103 becomes to be etched for a depth from the surface of the GaN film layer as becoming to be approximately 140 nm. And then thereby, it becomes able to obtain a layer structure that the surface of the pGaN layer 103 becomes to be exposed by removing the GaN film layer at the source side thereof, and also that the n$^-$GaN layer 303 becomes to exist on the pGaN layer 103 at the drain side thereof, as shown in FIG. 9 (a).

Next, there becomes to be accumulated an $SiO_2$ layer with becoming to have a film thickness thereof as 1 μm, that a part at an upper side of the N$^+$GaN layer 104 becomes to be opened, by performing a photo-lithography process. And then thereafter, as shown in FIG. 9 (b), by making use of the ion implantation equipment to be existent, with making use of a mask oxide film layer M31, and then by implanting Si ions into the pGaN layer 103 and the n$^-$GaN layer 303, there becomes to be formed the implanted region 104' (the first impurity implanted region) at the predetermined region (the first region) regarding the pGaN layer 103, and also there becomes to be formed the other implanted region 104' (the second impurity implanted region) at the predetermined region (the second region) regarding the n$^-$GaN layer 303, as shown in FIG. 7 (b) respectively (the impurity implantation process). Furthermore, a condition for the ion implantation in such the case thereof, it is able to design to be an one step implantation, wherein an amount of the dose is designed to be as approximately $1.5 \times 10^{15}$ cm$^{-2}$ for example (the symbol "×" means a multiplication operator), and an acceleration energy is designed to be as approximately 45 keV for example.

Figure 9C:
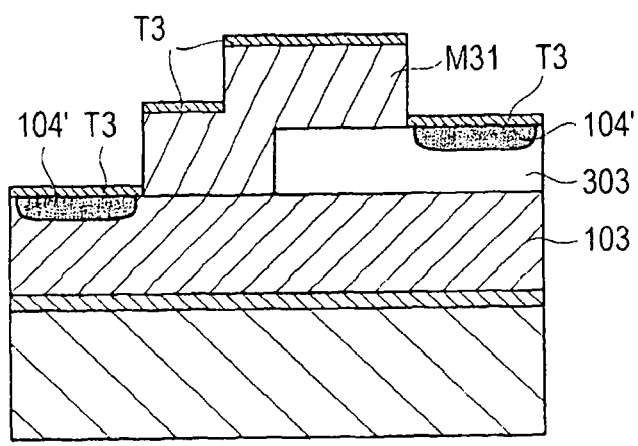

And then thereafter, by accumulating a substance, which has a narrow band gap, onto the implanted region 104' and onto the mask oxide film layer M31, there becomes to be formed an optical absorption layer T3, which becomes to have a film thickness as approximately 20 nm, as shown in FIG. 9C. Moreover, according to the present embodiment, there is used a-Si as the substance, which has the narrow band gap, and then there is made use of the CVD method for performing a film formation of such the substance for example. However, the present invention is not limited thereto, and it is able to apply thereto such as DLC, Ge, or the like as well, as similar to that according to the first embodiment regarding the present invention.

Next, by performing a process as similar to the process as described with reference to FIG. 3 (b) regarding the first embodiment according to the present invention, the optical absorption layer T3 on the mask oxide film layer M31 becomes to be removed by making use of the lift off method (an optical absorption layer formation process), and then thereafter there becomes to be formed a prevention film layer M3 for all over an upper surface of the substrate. And then thereafter, there is performed an annealing thereafter for the Si (an annealing process), which is implanted into the implanted region 104'. And then thereby, there becomes to be diffused the Si in the implanted region 104', and then the same becomes to be activated and to function as a dopant as well. Thus, there becomes to be formed thereby the n$^+$GaN region 104 for the pGaN layer 103 and for the n$^-$GaN layer 303 respectively. Furthermore, there may become to be formed the optical absorption layer T3 on the prevention film layer M3 as well.

And then thereafter, by performing a process as similar to the process as described with reference to FIG. 3 (c) regarding the first embodiment according to the present invention, there becomes to be performed a removing process for the optical absorption layer T3 and for the prevention film layer M3, and then there becomes to be formed a gate insulator layer 305, an electrode 107 and a gate electrode 306 (a gate insulating film layer formation process, a gate electrode formation process). And then thereby, there becomes to be produced the GaN based FET 300, which has a cross sectional structure as shown in FIG. 8. Furthermore, according to the present embodiment, it is possible to modify in a various manners as well, as similar to that according to the first or the second embodiment regarding the present invention.

Next, as a semiconductor device with making use of a semiconductor of a III group nitride compound according to the fourth embodiment regarding the present invention, there is provided a GaN based HEMT 400 as one example, and then a configuration thereof and a process for producing the same will be described in detail below, with reference to the drawings. Moreover, according to the description as below, a detailed description regarding a configuration as similar to that according to any one of the embodiments as from the first to the third will be omitted with making use of the similar symbol. Furthermore, regarding a matter as not to be mentioned specially therein, it is similar to that according to any one of the embodiments as from the first to the third.

Figure 10:
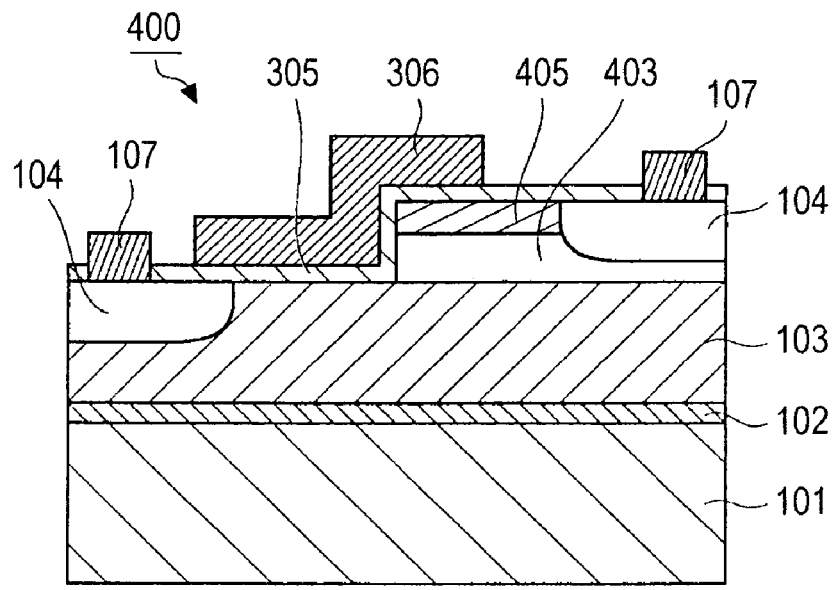
FIG. 10 is a cross sectional drawing showing a configuration of a GaN based HEMT 400 according to the fourth embodiment regarding the present invention.

FIG. 10 is a cross sectional drawing showing the configuration of the GaN based HEMT 400 according to the present embodiment. Moreover, FIG. 10 is the cross sectional drawing in a case of cutting off the GaN based HEMT 400 in a vertical direction to a substrate and in a parallel direction to a direction of a channel length, as similar to that as shown in FIG. 1.

As it is obvious with comparing between FIG. 10 and FIG. 8, regarding the GaN based HEMT 400 according to the present embodiment, for the embodiment as similar to the GaN based FET 300 according to the third embodiment regarding the present invention, the n⁻GaN layer 303 becomes to be replaced to a multilayer film layer, that is comprised of an n⁻GaN layer 403 and an n⁻AlGaN layer 405.

Further, such the n⁻GaN layer 403 is the film layer, that becomes to function as a carrier running layer, and then the same is formed with making use of a semiconductor of a III group nitride compound as a non-dope. However, the n⁻GaN layer 403 has an electro-conductivity of n-type as a small quantity thereof due to a residual donor therein according to a film formation process. Still further, it is able to design a film thickness thereof to be as approximately 100 nm for example. Still further, according to the present embodiment, there is applied the GaN thereto as the semiconductor of the III group nitride compound, however, the present invention is not limited thereto, and it is able to make use of a semiconductor of a nitride compound as well, that contains at least one as an element of the III group from Al, Ga, In and B, such as AlGaN, BGaN, BAlN, InGaN, AlN, InN, or the like.

Still further, the n⁻AlGaN layer 405 is the film layer, that becomes to function as a carrier supplying layer, and then the same generates a two dimensional electron gas at directly under an interface of heterojunction for the n⁻GaN layer 403, that functions as the carrier running layer. Still further, such the n⁻AlGaN layer 405 becomes to be formed with making use of a semiconductor of a III group nitride compound, that an impurity of n-type is doped thereinto. Still further, it is able to design a film thickness thereof to be as approximately 30 nm for example. Still further, according to the present embodiment, there is designed to make use of the AlGaN as the semiconductor of the III group nitride compound, and then Si ion is made use for such the impurity of n-type as well for example. Still further, there is designed a constitution for such the film layer to be as $Al_{0.2}Ga_{0.8}N$ for example, and then a density of the impurity is designed to be as approximately $1.0 \times 10^{17}$ cm⁻³ (the symbol "×" means a multiplication operator). Still further, according to the present embodiment, there is applied the AlGaN as the semiconductor of the III group nitride compound, however, the present invention is not limited thereto, and it is able to make use of a semiconductor of a nitride compound as well, that contains at least one as an element of the III group from Al, Ga, In and B, such as AlGaN, BGaN, BAlN, InGaN, AlN, InN, or the like. Still further, it is able to apply thereto such as Ge, Se, Te, or the like, as an impurity of n-type as well. Furthermore, all the other configuration thereof are similar to that according to any one of the embodiments as from the first to the third, and then a further detailed description will be omitted hereinafter.

Figure 11:
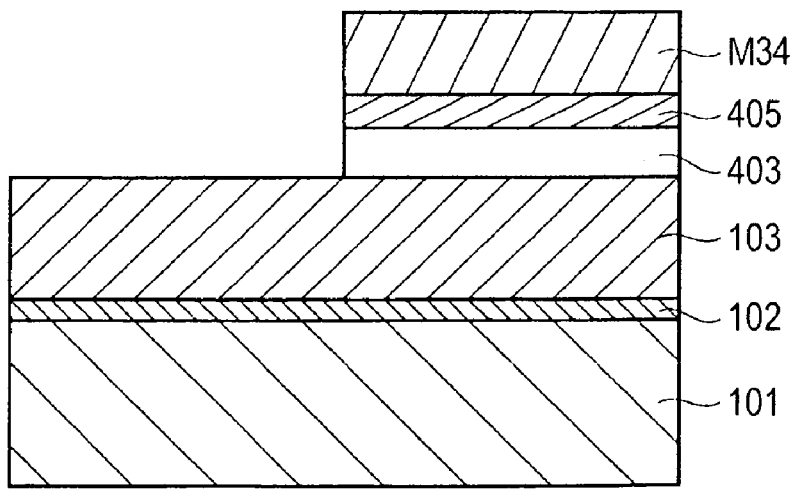
FIG. 11 is a process chart showing a process for producing the GaN based HEMT 400 according to the fourth embodiment regarding the present invention.

Next, a process for producing the GaN based HEMT 400 according to the present embodiment will be described in detail below, with making use of the drawings. Moreover, regarding a process as similar to the process as described in any one of the embodiments as from the first to the third, a detailed description will be omitted by referring to such the description therefrom. Further, FIG. 11 is a cross sectional drawing showing a process for producing the GaN based HEMT 400 according to the present embodiment, wherein such the cross section thereof corresponds to the cross section as shown in FIG. 10.

Here, according to the process for producing the GaN based HEMT 400 regarding the present embodiment, at first there is formed a substrate of layer structure as shown in FIG. 2 (*b*) by performing a process as similar to that according to the first embodiment regarding the present invention. And then thereafter, by making use of the MOCVD method for example, there becomes to be epitaxial grown a GaN film layer onto the pGaN layer 103, which becomes to have a film thickness as approximately 100 nm. Moreover, there is not made use of any dopant at all in a period of such the process, however, the GaN film layer to be grown becomes to have an electro-conductivity of n-type as a small quantity thereof due to a residual donor therein according to the film formation process. Furthermore, it is able to make use of such as the HVPE method, the MBE method, or the like as well for performing the film formation of such the GaN film layer.

And then thereafter, by making use of the MOCVD method for example, there becomes to be epitaxial grown an AlGaN film layer onto the above mentioned GaN film layer, which becomes to have a film thickness as approximately 30 nm. Furthermore, it becomes able to design a constitution for such the film layer to be as $Al_{0.2}Ga_{0.8}N$.

Next, by performing a process as similar to the process as described in the third embodiment with making use of FIG. 9 (*a*), there becomes to be formed a mask oxide film layer M34. And then with making use of the same as a mask thereafter, the AlGaN film layer, the GaN film layer and then the pGaN layer 103 become to be etched one after the other for a depth from a surface of the AlGaN film layer as becoming to be approximately 140 nm (a carrier running layer formation process, a carrier supplying layer formation process). And then thereby, it becomes able to obtain a layer structure that the surface of the pGaN layer 103 becomes to be exposed by removing the AlGaN film layer and the GaN film layer at the source side thereof, and also that the n⁻GaN layer 403, which is comprised of the GaN film layer, and the n⁻AlGaN layer 405, which is comprised of the AlGaN film layer, become to exist on the pGaN layer 103 at the drain side thereof, as shown in FIG. 11. Furthermore, as described above, the n⁻GaN layer 403 becomes to function as the carrier running layer, and the n⁻AlGaN layer 405 becomes to function as the carrier supplying layer.

And then thereafter, by performing a process as similar to the process as described with reference to FIGS. 9 (*b*) and the (*c*), and also FIG. 3 (*c*), regarding the third embodiment according to the present invention, there becomes to be formed the implanted region 104' (the first and the second impurity implanted region), there becomes to be formed the optical absorption layer T3 and the prevention film layer M3, there is performed a heat treatment for the impurity, which is doped into the implanted region 104', there is performed a removing process for the optical absorption layer T3 and for the prevention film layer M3, and then there becomes to be formed a gate insulator layer 305, an electrode 107 and a gate electrode 306 (an impurity implantation process, an optical absorption layer formation process, an annealing process, a gate insulating film layer formation process, and a gate electrode formation process). And then thereby, there becomes to be produced the GaN based HEMT 400, which becomes to have a cross sectional structure as shown in FIG. 10. Furthermore, according to the present embodiment, it is possible to modify in a various procedures therefore as well, as similar to that according to any one of the embodiments as from the first to the third regarding the present invention.

Next, as a semiconductor device with making use of a semiconductor of a III group nitride compound according to the fifth embodiment regarding the present invention, there is provided a GaN based semiconductor laser 500 as one example, and then a configuration thereof and a process for producing the same will be described in detail below, with reference to the drawings. Moreover, according to the description as below, a detailed description regarding a configuration as similar to that according to any one of the embodiments as from the first to the fourth will be omitted with making use of the similar symbol. Furthermore, regarding a matter as not to be mentioned specially therein, it is similar to that according to any one of the embodiments as from the first to the fourth.

Figure 12:
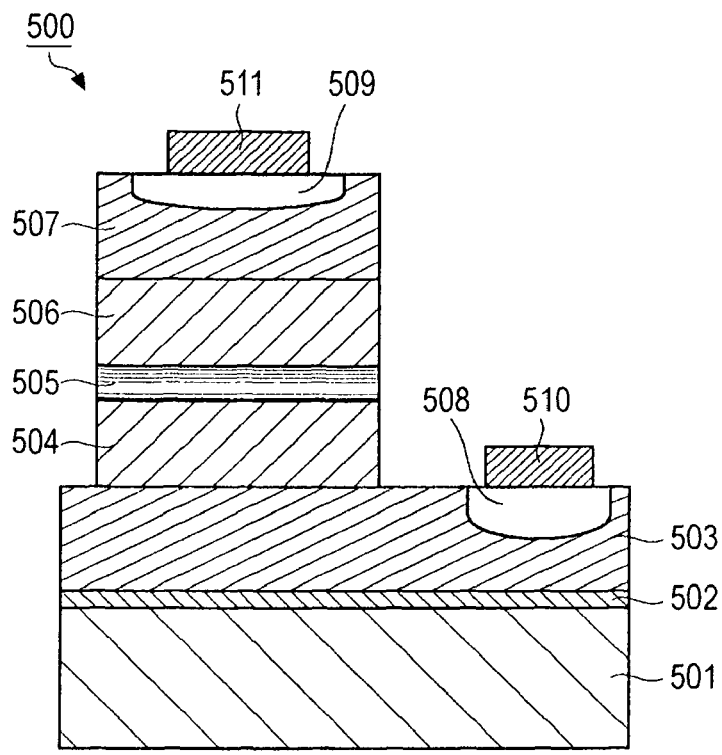
FIG. 12 is a cross sectional drawing showing a configuration of a GaN based laser 500 according to the fifth embodiment regarding the present invention.

FIG. 12 is a cross sectional drawing showing the configuration of the GaN based semiconductor laser 500 according to the present embodiment. Moreover, FIG. 12 is the cross sectional drawing in a case of cutting off the GaN based semiconductor laser 500 with a plane in a vertical direction to a substrate and with a plane in a vertical direction to a direction of an optical waveguide structure.

Further, such the GaN based semiconductor laser 500 comprises a configuration that a buffer layer 502 is formed on a substrate 501 as a sapphire substrate for example, as shown in FIG. 12. Still further, on such the buffer layer 502 there is formed a lower cladding layer 503, and then there is formed mesa structure, which is comprised of a lower optical confinement layer 504, an active layer 505, an upper optical confinement layer 506, and an upper cladding layer 507, that are formed on the lower cladding layer 503. Still further, at an upper layer of the lower cladding layer 503 there is formed an n⁺ diffusion region 508 for contacting thereto, without the region where the above mentioned structure is formed thereon. Still further, at an upper layer part of the upper cladding layer 507 there is formed an p⁺ diffusion region 509 for contacting thereto. Still further, on the n⁺ diffusion region 508 there is formed an electrode of n-type 510 to be ohmic contacted thereto, and then on the p⁺ diffusion region 509 there is formed an electrode of p-type 511 to be ohmic contacted thereto as similar thereto. Still further, according to such the GaN based semiconductor laser 500, there becomes to be coated a reflective film as a cavity mirror at both end faces regarding the optical guided wave path, as there is not shown in the figures.

Furthermore, according to the above description, it is able to apply such as a silicon substrate, a silicon carbide substrate, a zirconium boride substrate, or the like as well, to the substrate 501 in place of the above mentioned sapphire substrate.

Moreover, the buffer layer 502 is the layer for ensuring an adherence between the substrate 501 and the lower cladding layer 503. And then thereto it is able to apply a multi-layer (an AlGaN/GaN film layer) for example, that is comprised of AlGaN (aluminum gallium nitride) as undoped and GaN (gallium nitride). Further, it is able to design for a film thickness thereof to be as approximately 500 nm in total thereof for example.

Still further, the lower cladding layer 503 is the film layer, which is comprised of a semiconductor of a III group nitride compound that an impurity of n-type is doped thereinto. Here, according to the present embodiment, there is designed to make use of AlGaN as the semiconductor of the III group nitride compound, and then there is designed for a film thickness thereof to be as approximately 1.0 µm for example, and also there is designed for a constitution thereof to be as $Al_{0.2}Ga_{0.8}N$ for example. Still further, according to the present embodiment, there is designed to make use of Si ion for such the impurity of n-type, and then a density of the impurity is designed to be as approximately $10 \times 10^{17}$ cm$^{-3}$ for example (the symbol "×" means a multiplication operator). However, the present invention is not limited thereto, and it is able to make use of a semiconductor of a nitride compound as well, that contains at least one as an element of the III group from Al, Ga, In and B, such as AlGaN, BGaN, BAlN, InGaN, AlN, InN, or the like. Still further, it is able to apply such as Ge, Se, Te, or the like, to the impurity of n-type as well.

Still further, the lower optical confinement layer 504 becomes to function an effect of a optical confinement as arbitrary to a direction of laminating the film layers, by functioning as to be combined with the lower cladding layer 503. Still further, such the lower optical confinement layer 504 is the film layer, which is comprised of a semiconductor of a III group nitride compound as an undoped for example. However, it may contain an impurity, which has an electro-conductivity as similar to that of the lower cladding layer. Still further, according to the present embodiment, there is designed to make use of GaN as the semiconductor of the III group nitride compound for forming the lower optical confinement layer 504, and then there is designed for a film thickness thereof to be as approximately 60 nm for example.

Still further, the active layer 505 is the layer to emit light therefrom due to an carrier injection current thereinto. Still further, it is able to form such the active layer 505 with making use of a film layer, which is comprised of InGaN as an undoped. Still further, it is able to design for a film thickness thereof to be as approximately 5 nm for example.

Still further, the upper optical confinement layer 506 becomes to function the effect of the light confinement as arbitrary to the direction of laminating the film layers, by functioning as to be combined with the upper cladding layer 507, which will be described in detail below. Still further, such the upper optical confinement layer 506 is the film layer, which is comprised of a semiconductor of a III group nitride compound as an undoped for example. However, it may contain an impurity, which has an electro-conductivity as similar to that of the upper part cladding layer. Still further, according to the present embodiment, there is designed to make use of GaN as the semiconductor of the III group nitride compound for forming the upper optical confinement layer 506, and then there is designed for a film thickness thereof to be as approximately 60 nm for example.

Still further, the upper cladding layer 507 is the film layer, which is comprised of a semiconductor of a III group nitride compound that an impurity of p-type is doped thereinto. Here, according to the present embodiment, there is designed to make use of AlGaN as the semiconductor of the III group nitride compound, and then there is designed for a film thickness thereof to be as approximately 1.0 µm for example, and also there is designed for a constitution thereof to be as $Al_{0.2}Ga_{0.8}N$ for example. Still further, according to the present embodiment, there is designed to make use of Mg ion for such the impurity of p-type, and then a density of the impurity is designed to be as approximately $1.0 \times 10^{17}$ cm$^{-3}$ for example (the symbol "×" means a multiplication operator). However, the present invention is not limited thereto, and it is able to make use of a semiconductor of a nitride compound as well, that contains at least one as an element of the III group from Al, Ga, In and B, such as AlGaN, BGaN, BAlN, InGaN, AlN, InN, or the like. Still further, it is able to apply such as Be, Zn, C, or the like, to the impurity of p-type as well.

Still further, the n$^+$ diffusion region 508 is the region where an impurity of n-type is doped thereinto with a relatively high density, that is formed at the lower cladding layer 503. Still further, according to the present embodiment, there is designed to make use of Si ion for such the impurity of n-type for example. However, the present invention is not limited thereto, and it is able to make use of such as Ge, Se, Te, or the like as well. On the contrary, the p$^+$ diffusion region 509 is the region where an impurity of p-type is doped thereinto with a relatively high density, that is formed at the upper cladding layer 507. Still further, according to the present embodiment, there is designed to make use of Mg ion for such the impurity of p-type for example. However, the present invention is not limited thereto, and it is able to make use of such as Be, Zn, C, or the like as well.

Still further, the n-type ohmic electrode 510 is formed on the n$^+$ diffusion region 508, and then the same becomes to function for reducing a resistance between the n$^+$ diffusion region 508 and a metal wire (not shown in the figures), which is formed on an upper layer thereof. Still further, it is able to form such the electrode of n-type 510 with making use of such a Ti/Al film layer configured of a Ti layer and an Al layer for example. Still further, the p-type electrode 511, which is formed on the p$^+$ diffusion region 509, and then the same becomes to function for reducing a resistance between the p$^+$ diffusion region 509 and a metal wire (not shown in the figures), which is formed on an upper layer thereof. Still further, it is able to form such the electrode of p-type 511 with making use of a laminated film layer (Ni/Au film layer) configured of an Ni (a nickel) layer and an Au (a gold) layer for example. Furthermore, such the electrode of n-type 510 and the electrode of p-type 511 are not limited to the above mentioned configuration, and it is able to modify in a various manners as well, if each of such the layers is a conductor film layer with which it is possible to be ohmic contacted with each of the diffusion regions (the 508 and the 509).

Next, a process for producing the GaN based semiconductor laser 500 according to the fifth embodiment regarding the present invention will be described in detail below, with making use of the drawings. Moreover, from FIG. 13 through FIG. 15B are cross sectional drawings individually showing a process for producing the GaN based semiconductor laser 500 according to the present embodiment. Furthermore, each of the cross sections thereof corresponds to that as shown in FIG. 12 respectively.

Here, regarding a process for producing the GaN based semiconductor laser 500 according to the present embodiment, at first an undoped AlGaN layer and then an undoped GaN layer becomes to be epitaxially grown one after the other onto a substrate 501 as a processing object, by making use of the MOCVD method for example. Moreover, in such the case thereof, it is controlled for a film thickness thereof as in total to become approximately 500 nm for example. And then thereby, it becomes able to form a buffer layer 502 (refer to FIG. 13), which is comprised of the undoped AlGaN/GaN layers. Furthermore, a method of a film formation for such the buffer layer 502 is not limited to the MOCVD method, and it is able to make use of such as the HVPE method, the MBE method, or the like as well.

And then thereafter, by making use of the MOCVD method as similar thereto, an AlGaN film layer becomes to be epitaxially grown onto the buffer layer 502, that Si becomes to be doped therein, for becoming a film thickness thereof to be as approximately 1.0 µm for example. Moreover, in such the case thereof, by controlling a density of Si therein to become as approximately $5.0 \times 10^{18}$ cm$^{-3}$ (the symbol "×" means a multiplication operator), it becomes able to form the lower cladding layer 503 (refer to FIG. 13) in which an impurity of n-type becomes to be doped thereinto with a density thereof as relatively lower.

And then thereafter, by making use of the MOCVD method as similar thereto, an undoped GaN film layer (referred to as a lower layer unGaN film hereinafter) 504A, that becomes to have a film thickness thereof as approximately 60 nm for example, an undoped InGaN film layer (referred to as an unInGaN film layer hereinafter) 505A, that becomes to have a film thickness thereof as approximately 5 nm for example, and then another undoped GaN film layer (referred to as an upper layer unGaN film hereinafter) 506A, that becomes to have a film thickness thereof as approximately 60 nm for example, become to be epitaxially grown one after the other onto the lower cladding layer 503 (refer to FIG. 13).

And then thereafter, by making use of the MOCVD method as similar thereto, an AlGaN film layer (referred to as an pAlGaN film layer hereinafter) 507A becomes to be epitaxially grown onto the upper layer unGaN film 506A (a laminated film layer formation process), that Mg becomes to be doped therein as the impurity of p-type, for becoming a film thickness thereof to be as approximately 1.0 µm for example. Moreover, in such the case thereof, by controlling a density of Mg therein to become as approximately $5.0 \times 10^{18}$ cm$^{-3}$ (the symbol "×" means a multiplication operator), it becomes able to form the pAlGaN film layer 507A in which the impurity of p-type becomes to be doped thereinto with a density as relatively lower. Furthermore, each of the film formation methods, for forming the lower cladding layer 503, the lower layer unGaN film 504A, the unInGaN film layer 505A, the upper layer unGaN film 506A, and for the pAlGaN film layer 507A, is not limited to the MOCVD method individually, and it is able to make use of such as the HVPE method, the MBE method, or the like individually as well.

And then thereafter, by accumulating a substance onto the pAlGaN film layer 507A, that has a narrow band gap energy, it becomes able to form an optical absorption layer T51, that is comprised of a dielectric film layer. Moreover, according to the present embodiment, as similar to that according to the first embodiment regarding the present invention, there is used Ge as the substance as well, which has the narrow band gap, and then there is made use of the CVD method for the accumulation of such the substance for example. However, the present invention is not limited thereto, and it is able to apply thereto such as DLC, a-Si, or the like as well, as similar to that according to the first embodiment regarding the present invention.

Figure 13:
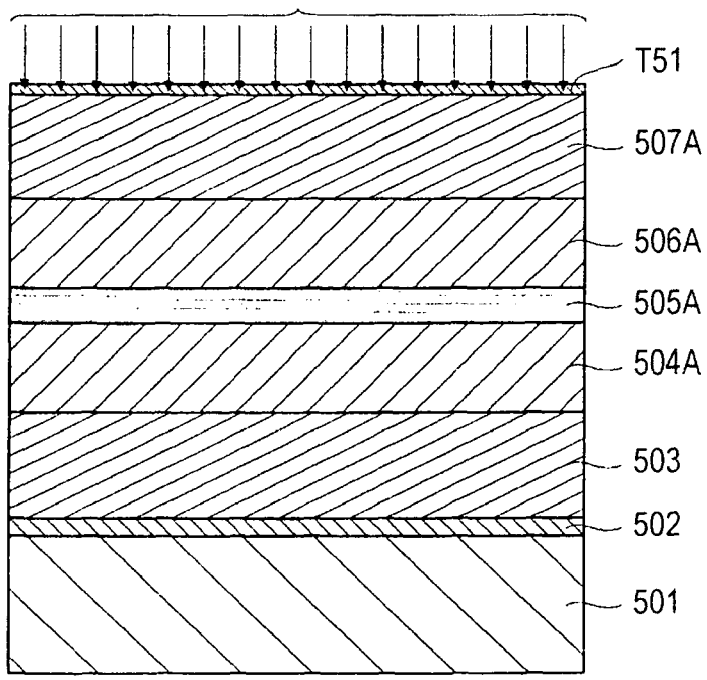
FIG. 13 is a process chart showing a process (1) for producing the GaN based laser 500 according to the fifth embodiment regarding the present invention.
Figure 14A:
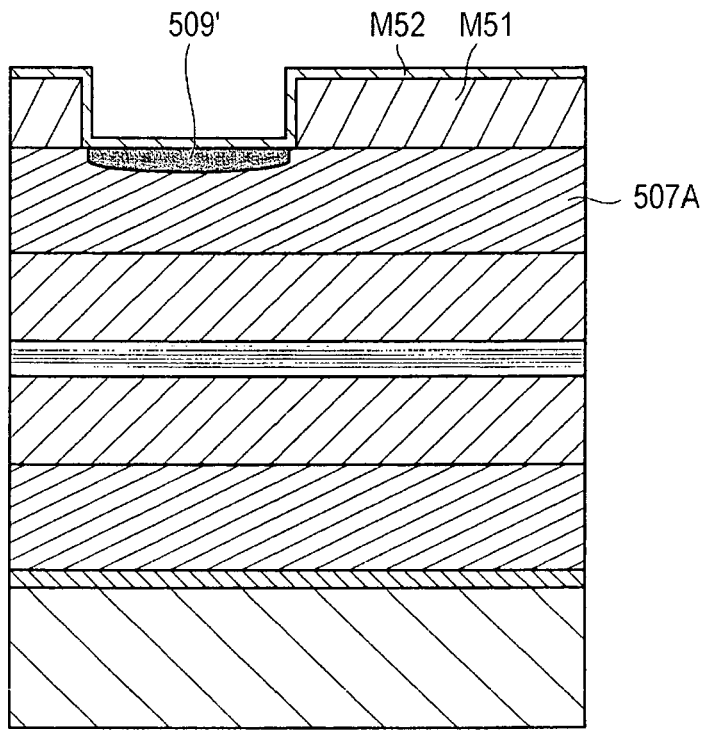
FIGS. 14A and 14B are process charts showing a process (2) for producing the GaN based laser 500 according to the fifth embodiment regarding the present invention.
Figure 14B:
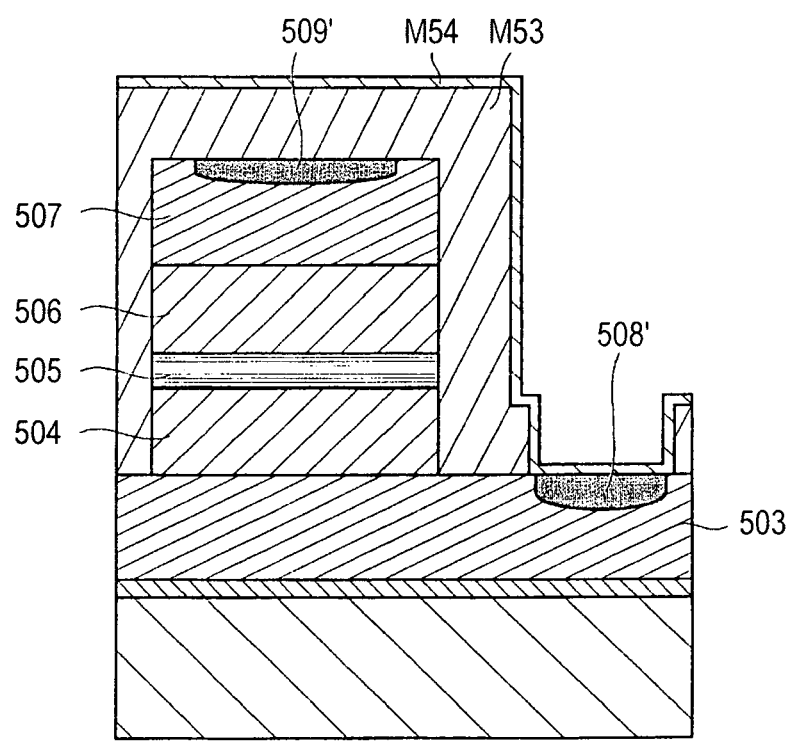
Figure 15A:
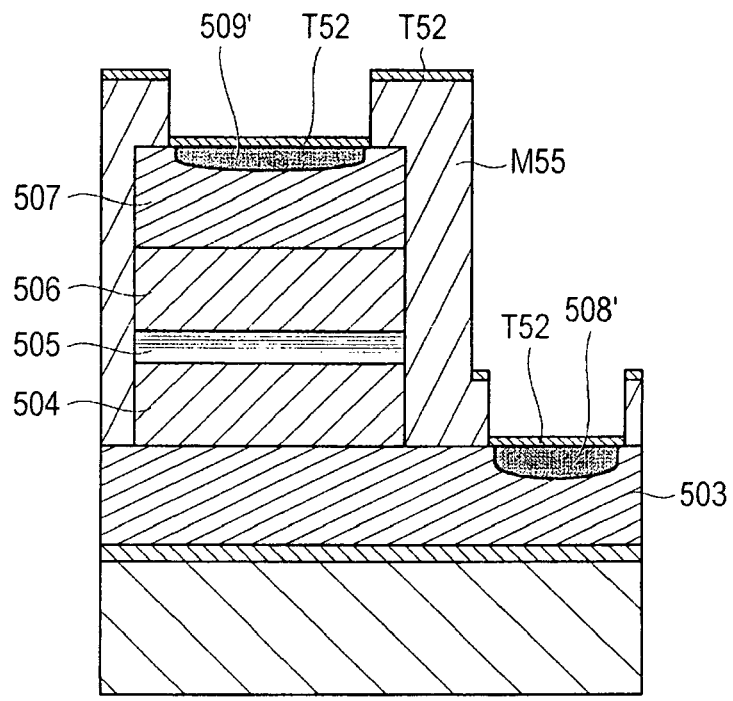
FIGS. 15A and 15B are process charts showing a process (3) for producing the GaN based laser 500 according to the fifth embodiment regarding the present invention.
Figure 15B:
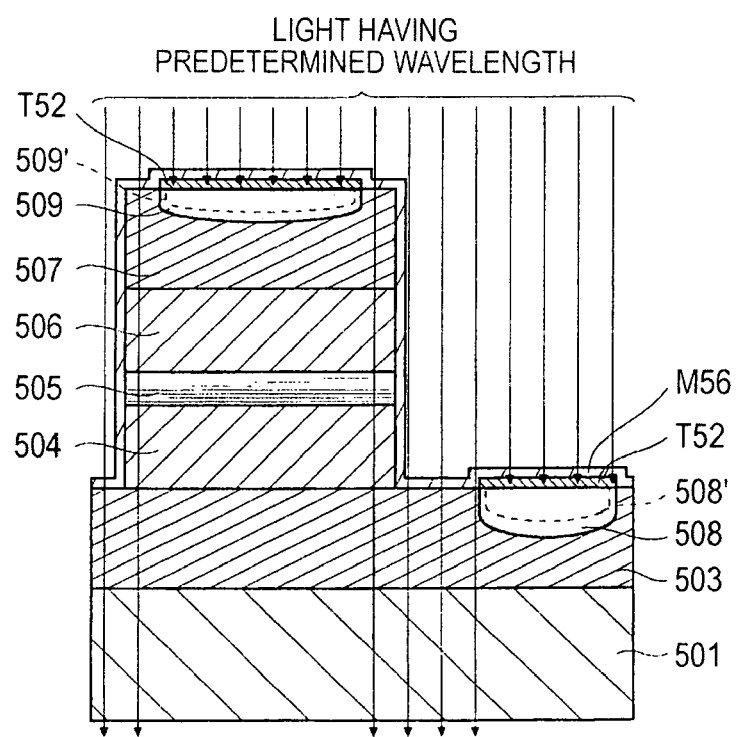

And then thereafter, by performing an annealing step with making use of an RTA (a rapid thermal anneal) equipment to be existent for example, the Mg in the pAlGaN film layer 507A becomes to be activated, as shown in FIG. 13. Moreover, regarding a condition of annealing in the case thereof, it is set for a temperature of an electric heating furnace to be as approximately 800° C. and for a processing time thereof to be approximately thirty minutes. And then thereby, as similar to that according to the other embodiments regarding the present invention, the optical absorption layer T51 becomes to be raised the temperature thereof, that is formed at each part as right above the pAlGaN film layer 507A, and then it becomes possible for the Mg, which is doped into the pAlGaN film layer 507A, to be activated thereby, with keeping the temperature of the other regions to be as lower.

Next, the optical absorption layer T51 becomes to be removed by performing a wet etching process with making use of an aqueous solution of a hydrofluoric acid based for example. And then thereafter, by making use of the PECVD method for example, there becomes to be formed a silicon oxide film layer onto the pAlGaN film layer 507A, that becomes to have a film thickness as approximately 1000 nm for example. And then thereafter, a photo resist solution becomes to be spin coated onto such the silicon oxide film layer, and then by performing an exposure process and a development process, it becomes able to form the photo resist, which has an open part at an upper region for a region where the p$^+$ diffusion region 509 becomes to be formed. And then thereafter, with making use of such the photo resist as a mask, by performing a wet etching process with making use of an aqueous solution of a hydrofluoric acid based for example for such the silicon oxide film layer, it becomes able to form a mask oxide film layer M51 (refer to FIG. 14A), which has an open part for exposing an upper surface of the region where the p$^+$ diffusion region 509 becomes to be formed regarding the pAlGaN film layer 507A. And then thereafter, by making use of the PECVD method for example, there becomes to be formed an overcoat film layer M52, which is comprised of another silicon oxide film layer and the same becomes to have a film thickness as approximately 20 nm for example.

And then thereafter, by making use of the ion implantation equipment to be existent, with making use of the mask oxide film layer M51, and then by implanting Mg ions into an upper layer of the pAlGaN layer 507A, there becomes to be formed an implanted region 509' (a first impurity implanted region) as shown in FIG. 14 ($a$) (a first impurity implantation process). Moreover, a condition for the ion implantation in such the case thereof, it is able to design for an amount of the dose to be as approximately $3.0 \times 10^{15}$ cm$^{-2}$ for example (the symbol "×" means a multiplication operator), and for an acceleration energy to be as approximately 25 keV for example. Furthermore, the overcoat film layer M52 is the film layer for reducing a damage, that the surface of the pAlGaN layer 507A may be received at the period when the impurity is implanted thereinto, as similar to the overcoat film layer M2 according to the first embodiment regarding the present invention.

And then thereafter, the silicon oxide film layer including the above mentioned mask oxide film layer is removed from all over the surface thereof by performing a wet etching process with making use of an aqueous solution of a hydrofluoric acid based for example. And then thereafter, by making use of the PECVD method for example, there becomes to be formed another silicon oxide film layer onto such the surface thereof, that becomes to have a film thickness as approximately 1000 nm for example. And then thereafter, a photo resist solution becomes to be spin coated onto such the silicon oxide film layer, and then by performing an exposure process and a development process, it becomes able to form the photo resist, which becomes to have an open part at an upper region for a region where the n$^+$ diffusion region 508 becomes to be formed. And then thereafter, with making use of such the photo resist as a mask, by performing a wet etching process with making use of an aqueous solution of a hydrofluoric acid based for example for such the silicon oxide film layer, it becomes able to form a mask oxide film layer M53 (refer to FIG. 14B), which has an open part for exposing an upper surface of the region where the n$^+$ diffusion region 508 becomes to be formed regarding the lower cladding layer 503. And then thereafter, by making use of the PECVD method for example, there becomes to be formed an overcoat film layer M54 (refer to FIG. 14 ($b$)), which is comprised of another silicon oxide film layer and the same becomes to have a film thickness as approximately 20 nm for example.

And then thereafter, by making use of the ion implantation equipment to be existent, with making use of the mask oxide film layer M53, and then by implanting Si ions into an upper layer of the lower cladding layer 503, there becomes to be formed an implanted region 508' (a second impurity implanted region) as shown in FIG. 14 ($b$) (a second impurity implantation process). Moreover, a condition for the ion implantation in such the case thereof, it is able to design for an amount of the dose to be as approximately $1.5 \times 10^{15}$ cm$^{-2}$ for example (the symbol "×" means a multiplication operator), and for acceleration energy to be as approximately 25 keV for example. Furthermore, the overcoat film layer M54 is the film layer for reducing a damage, that the surface of the lower cladding layer 503 may be received at the period when the impurity is implanted thereinto, as similar to the overcoat film layer M2 according to the first embodiment regarding the present invention.

And then after implanting Si ions and Mg ions thereinto respectively, next, the silicon di-oxide film layer, which includes the overcoat film layer M54 and the mask oxide film layer M53, is removed from all over the surface thereof by performing a wet etching process with making use of an aqueous solution of a hydrofluoric acid based for example. And then thereafter, by making use of the PECVD method for example, there becomes to be formed another silicon oxide film layer onto such the surface thereof, that becomes to have a film thickness as approximately 1000 nm for example. And then thereafter, a photo resist solution becomes to be spin coated onto such the silicon oxide film layer, and then by performing an exposure process and a development process, it becomes able to form the photo resist, which has an open part at an upper region for the implanted region 508' and another open part at an upper region for the implanted region 509' respectively. And then thereafter, with making use of such the photo resist as a mask, by performing a wet etching process with making use of an aqueous solution of a hydrofluoric acid based for example for such the silicon oxide film layer, it becomes able to shape a mask oxide film layer M55 (refer to FIG. 15A), which has the open parts for individually exposing an upper surface of the implanted region 508' and an upper surface of the implanted region 509' respectively.

And then thereafter, by accumulating a substance, that has a narrow band gap energy, onto the implanted region 508' and the 509', and onto the mask oxide film layer M55, it becomes able to form an optical absorption layer T52 as shown in FIG. 15, which become to have a film thickness as approximately 20 nm for example. Moreover, according to the present embodiment, as similar to that according to the first embodiment regarding the present invention, there is used Ge as the substance as well, which has the narrow band gap, and then there is made use of the CVD method for the accumulation of such the substance for example. However, the present invention is not limited thereto, and it is able to apply thereto such as DLC, a-Si, or the like as well, as similar to that according to the first embodiment regarding the present invention.

Next, the mask oxide film layer M55 becomes to be removed by performing a wet etching process with making use of an aqueous solution of a hydrofluoric acid based for example. And then thereby the optical absorption layer T52 on the mask oxide film layer M55 becomes to be removed by making use of the lift off method (an optical absorption layer formation process), with retaining the optical absorption layer T52 which is formed on the implanted region 508' and the 509'.

And then thereafter, by making use of the reactive spattering method for example, there becomes to be formed a prevention film layer M56 (refer to FIG. 15B), that is comprised of a silicon di-oxide film layer with becoming to have a film thickness thereof as approximately 500 nm for example, for coating mesa structure, which is comprised of the lower cladding layer 503, the lower optical confinement layer 504, the active layer 505, the upper optical confinement layer 506, and of the upper cladding layer 507, and for coating the optical absorption layer T52. And then such the prevention film layer M56 becomes to function as a film layer for reducing a number of N atoms to be come off from the lower cladding layer 503 and from the mesa structure in a period of an annealing process thereafter, as similar to the prevention film layer M3 according to the first embodiment regarding the present invention. Moreover, as such the prevention film layer M56, it is able to apply such as a silicon nitride layer, an aluminum nitride film layer, or the like as well in place of the silicon di-oxide film layer, as similar to that according to the first embodiment regarding the present invention. Furthermore, it may be available for the optical absorption layer T52 to be formed onto the prevention film layer M56 as well.

And then after forming the $n^+$ diffusion region 508 and the $p^+$ diffusion region 509 by performing a heat treatment individually for Si and Mg, next, all of the optical absorption layer T52, which is comprised of Ga, and of the prevention film layer M56 are completely removed by performing a wet etching process with making use of an aqueous solution of a hydrofluoric acid based for example. Moreover, in a case where the prevention film layer M56 is formed with making use of an AlN film layer, it becomes to design for such the prevention film layer M56 to be removed with making use of KOH solution for example.

And then thereafter, by making use of the electron beam evaporation method and then by performing the lift off process for example, it becomes able to form an ohmic electrode 510 of a Ti/Au layer structure.

And then thereafter, by performing the lift off process as similar to that according to the above description, there becomes to be formed an electrode of p-type 511 on an upper surface of the $p^+$ diffusion region 509 regarding the upper cladding layer 507, which is comprised of an Ni/Au film layer to be ohmic contacted therewith. Moreover, an upper layer is formed thereafter as not shown in the figures, and then each of end faces becomes to be formed by performing a dicing process at both ends of the guided wave path for the substrate 501 on which each of the above mentioned layers is formed. And then thereafter, there becomes to be formed a reflective film layer for each of such the end faces respectively. And then thereby, it becomes able to produce the GaN based semiconductor laser 500, which becomes to have the cross sectional structure as shown in FIG. 12. Furthermore, according to the present embodiment, it is possible to modify in a various manners, as similar to that according to any one of the embodiments as from the first to the fourth regarding the present invention.

The Sixth Embodiment

Next, as a semiconductor device with making use of a semiconductor of a III group nitride compound according to the sixth embodiment regarding the present invention, there is provided a GaN based semiconductor laser 600 as one example, and then a configuration thereof and a process for producing the same will be described in detail below, with reference to the drawings. Moreover, according to the description as below, a detailed description regarding a configuration as similar to that according to any one of the embodiments as from the first to the fifth will be omitted with making use of the similar symbol. Furthermore, regarding a matter as not to be mentioned specially therein, it is similar to that according to any one of the embodiments as from the first to the fifth.

Figure 16:
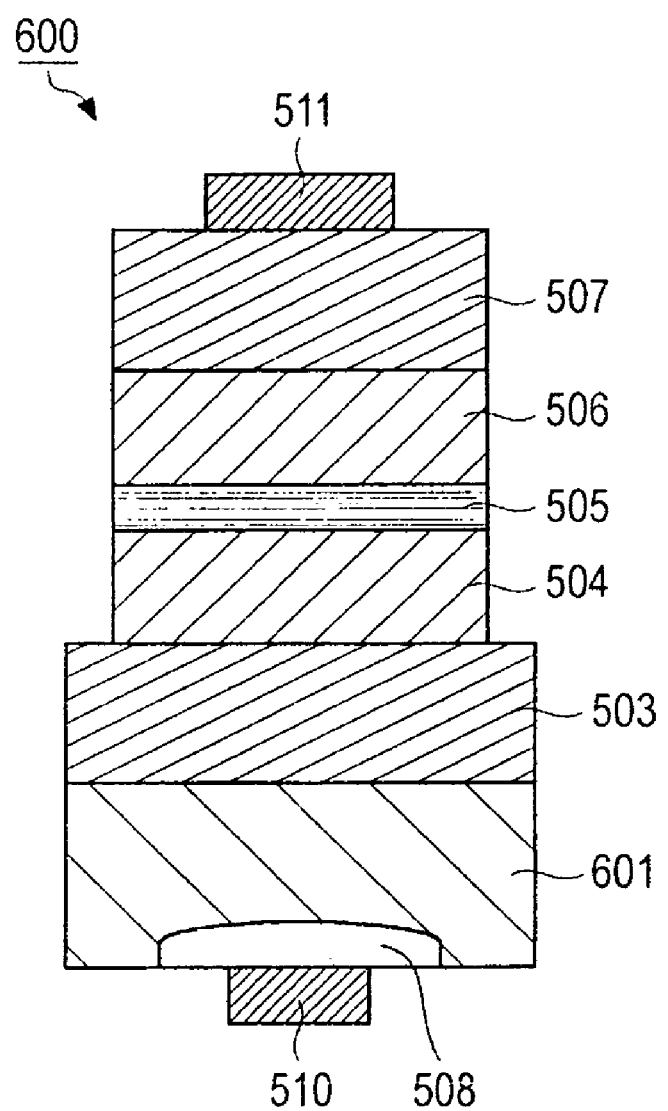
FIG. 16 is a cross sectional drawing showing a configuration of a GaN based laser 600 according to the sixth embodiment regarding the present invention.

Here, FIG. 16 is a cross sectional drawing showing the configuration of the GaN based semiconductor laser 600 according to the present embodiment. Moreover, FIG. 16 is the cross sectional drawing in a case of cutting off the GaN based semiconductor laser 600 with a plane in a vertical direction to a substrate and with a plane in a vertical direction to a direction of an optical wave guided structure.

As it is obvious with comparing between FIG. 16 and FIG. 12, regarding the GaN based semiconductor laser 600 according to the present embodiment, for the embodiment as similar to the GaN based semiconductor laser 500 according to the fifth embodiment regarding the present invention, the substrate 501 is replaced to a substrate 601, which is comprised of a semiconductor of a III group nitride compound that an impurity of n-type is doped thereinto, and also there becomes to be formed an $n^+$ diffusion region 508 and an electrode of n-type 510 for contacting at a rear surface of the substrate 601. Moreover, according to the present embodiment, there becomes to be omitted the $p^+$ diffusion region 509 for contacting therein, that is formed at a side for the upper cladding layer 507 according to the fifth embodiment regarding the present invention. However, such the $p^+$ diffusion region 509 may be not omitted therein either.

Further, according to the above description, such the substrate 601 becomes to be formed with making use of the n-type III group nitride compound ($n^-$-GaN). Here, according to the present embodiment, there is adopted an $n^-$GaN substrate as one example, that there is applied Si thereto as the impurity of n-type with a density thereof to be as relatively lower. Furthermore, all the other configurations thereof are similar to that according to the fifth embodiment, and then a detailed description will be omitted hereinafter.

Next, a process for producing the GaN based semiconductor laser 600 according to the sixth embodiment regarding the present invention will be described in detail below, with making use of the drawings. Moreover, from FIG. 17A through FIG. 18B are cross sectional drawings individually showing a process for producing the GaN based semiconductor laser 600 according to the present embodiment. Furthermore, each of the cross sections thereof corresponds to that as shown in FIG. 12 respectively.

Here, regarding a process for producing the GaN based semiconductor laser according to the present embodiment, at first an AlGaN film layer becomes to be epitaxially grown onto an upper surface (a first surface) of a substrate 601 as a processing object by making use of the MOCVD method for example, that Si becomes to be doped therein, and then for becoming a film thickness thereof to be as approximately 1.0 µm for example. Moreover, in such the case thereof, by controlling a density of Si therein to become as approximately $5.0 \times 10^{18}$ cm$^{-3}$ (the symbol "×" means a multiplication operator), it becomes able to form the lower cladding layer 503 (refer to FIG. 17(a)) in which the impurity of n-type is doped thereinto with the density thereof as relatively lower (a lower cladding layer formation process).

And then thereafter, by performing a process as similar to that as described with reference to FIG. 13 through FIG. 14 (b) in the fifth embodiment according to the present invention, there becomes to be formed a mesa structure, which is comprised of a lower optical confinement layer 504, an active layer 505, an upper optical confinement layer 506, and an upper cladding layer 507 thereon (refer to FIG. 17 (a)).

And then thereafter, by making use of the PECVD method for example, there becomes to be formed a silicon di-oxide film layer onto all over the upper surface of the substrate, which becomes to have a film thickness as approximately 1000 nm for example. And then thereafter, a photo resist solution becomes to be spin coated onto such the silicon di-oxide film layer, and then by performing an exposure process and a development process, it becomes able to form the photo resist, which becomes to have an open part at an upper surface of the upper cladding layer 507. And then thereafter, with making use of such the photo resist as a mask, by performing a wet etching process with making use of an aqueous solution of a hydrofluoric acid based for example for such the silicon di-oxide film layer, it becomes able to form an open part at the silicon oxide film layer for exposing a part of the upper surface of the upper cladding layer 507.

And then thereafter, by making use of the electron beam evaporation method for example, there becomes to be formed Ni layer and an Au layer (Ni/Au) onto the above mentioned silicon di-oxide film layer and onto the upper cladding layer 507 to be exposed thereby. And then thereafter, by removing such the silicon di-oxide film layer by performing a wet etching process with making use of an aqueous solution of a hydrofluoric acid based for example, the Ni/Au film layer on the silicon oxide film layer becomes to be removed by making use of the lift off method, with retaining the Ni/Au film layer on the upper cladding layer 507. And then thereby, it becomes able to form the mesa structure, which is comprised of the lower optical confinement layer 504, the active layer 505, the upper optical confinement layer 506, and of the upper cladding layer 507, and to form an electrode of p-type 511 to be ohmic contacted with the upper cladding layer 507 regarding such the structure, as shown in FIG. 17 (a).

Figure 17A:
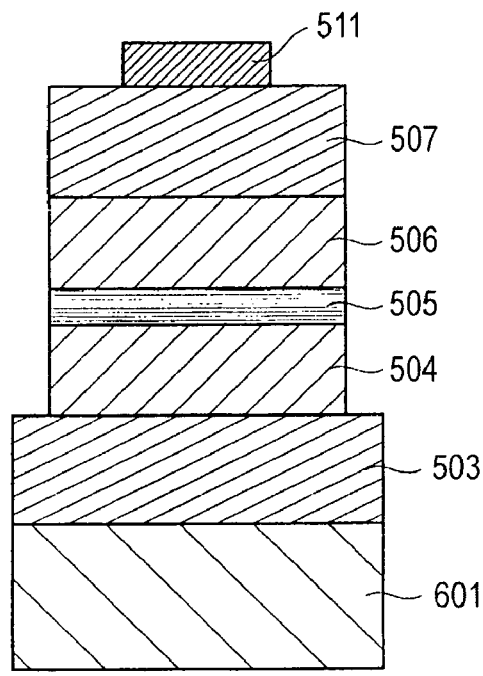
FIGS. 17A and 17B are process charts showing a process (1) for producing the GaN based laser 600 according to the sixth embodiment regarding the present invention.
Figure 17B:
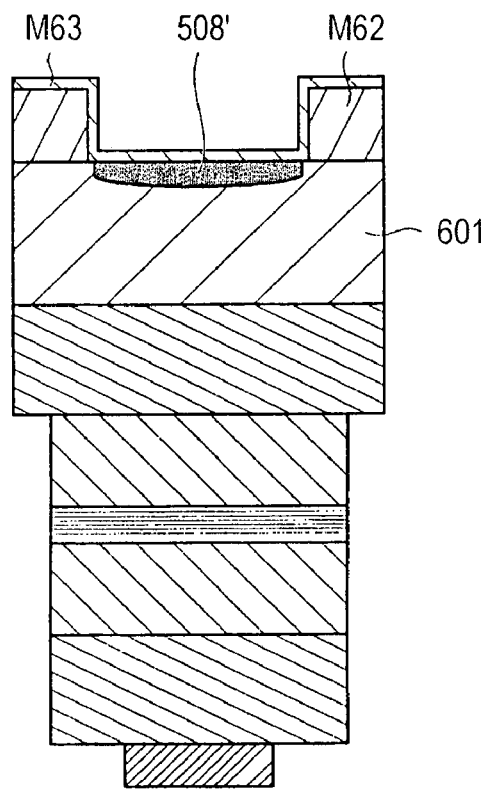

And then thereafter, by making use of the ion implanter to be existent, with making use of the mask oxide film layer M62 as a mask, and then by implanting Si ions into the rear surface of the substrate 601, there becomes to be formed an implanted region 508' at the rear surface of the substrate 601 as shown in FIG. 17 B (an impurity implantation process). Moreover, a condition for the ion implantation in such the case thereof, it is able to design for an amount of the dose to be as approximately $1.5 \times 10^{15}$ cm$^{-2}$ for example (the symbol "×" means a multiplication operator), and for an acceleration energy to be as approximately 25 keV for example. Furthermore, an overcoat film layer M63 is the film layer for reducing a damage, that the rear surface of the substrate 601 may be received at the period when the impurity is implanted thereinto, as similar to the overcoat film layer M2 according to the first embodiment regarding the present invention.

And then after implanting Si ions into the rear surface of the substrate 601 in such the above mentioned way, next, there becomes to be removed the silicon di-oxide film layer with a thickness thereof as approximately 20 nm, by performing a wet etching process with making use of an aqueous solution of a hydrofluoric acid based for example. Hence, the overcoat film layer M63 becomes to be removed thereby, and then the implanted region 508' becomes to be exposed therefrom.

Figure 18A:
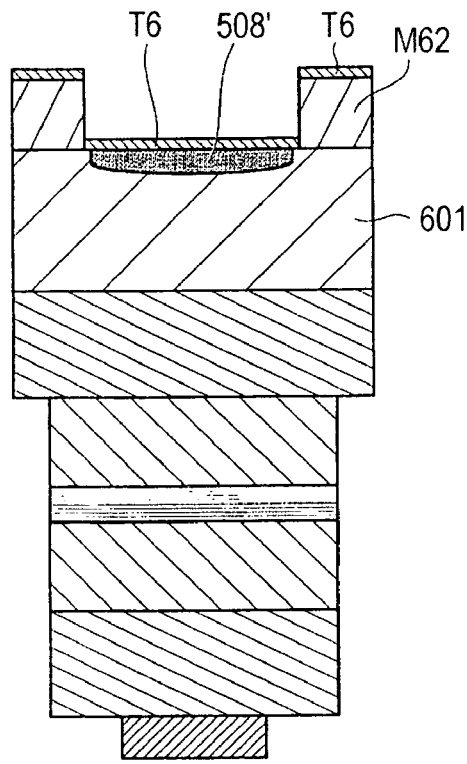
FIGS. 18A and 18B are process charts showing a process (2) for producing the GaN based laser 600 according to the sixth embodiment regarding the present invention.
Figure 18B:
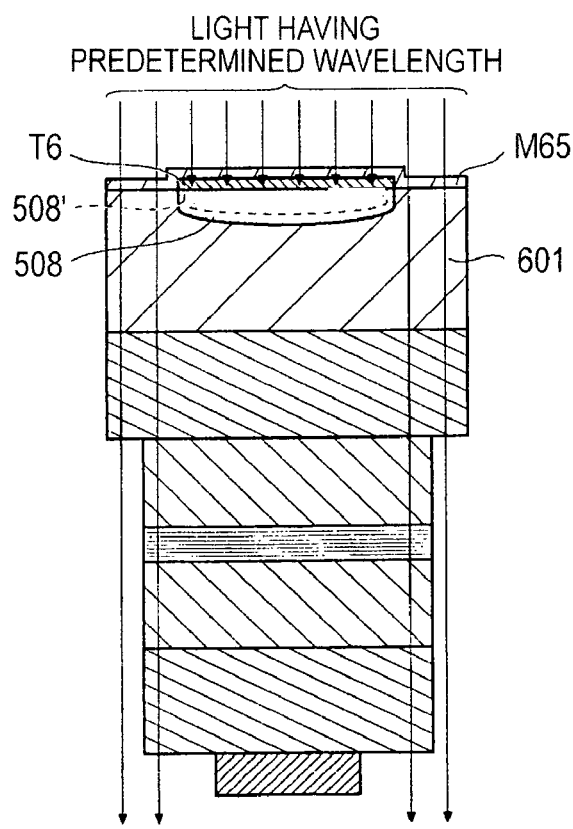

And then thereafter, by accumulating a substance, that has a narrow band gap energy, onto the implanted region 508' and onto the mask oxide film layer M62, it becomes able to form an optical absorption layer T6 as shown in FIG. 18 A, which become to have a film thickness as approximately 20 nm for example. Moreover, according to the present embodiment, as similar to that according to the fifth embodiment regarding the present invention, there is used Ge as the substance as well, which has the narrow band gap, and then there is made use of the CVD method for the accumulation of such the substance for example. However, the present invention is not limited thereto, and it is able to apply thereto such as DLC, a-Si, or the like as well, as similar to that according to the first embodiment regarding the present invention.

Next, the mask oxide film layer M62 becomes to be removed by performing a wet etching process with making use of an aqueous solution of a hydrofluoric acid based for example. And then thereby the optical absorption layer T6 on the mask oxide film layer M62 becomes to be removed by making use of the lift off method (an optical absorption layer formation process), with retaining the optical absorption layer T6 which is formed on the implanted region 508'.

And then thereafter, by making use of the reactive spattering method for example, there becomes to be formed a prevention film layer M65 (refer to FIG. 18 (b)), that is comprised of a silicon di-oxide film layer with becoming to have a film thickness as approximately 500 nm for example, for coating the substrate 601 and the optical absorption layer T6. And then such the prevention film layer M65 becomes to function as a film layer for reducing a number of N atoms to be come off from the substrate 601 in a period of an annealing step as a process thereafter, as similar to the prevention film layer M3 according to the first embodiment regarding the present invention. Moreover, as such the prevention film layer M65, it is able to apply such as a silicon nitride layer, an aluminum nitride layer, or the like as well in place of the silicon di-oxide film layer, as similar to that according to the first embodiment regarding the present invention. Furthermore, it may be available for the optical absorption layer T6 to be formed onto the prevention film layer M65 as well.

And then thereafter, by performing an annealing step for the substrate 601 from the rear surface thereof, that the optical absorption layer T6 is formed thereon, by performing a process as similar to that as described with reference to FIG. 15 (b) in the fifth embodiment according to the present invention, there becomes to be diffused the Si and then to be activated the same, which is implanted into the implanted region 508' (an annealing process), as shown in FIG. 18 (b). And then in the case thereof, as similar to that according to the other embodiments regarding the present invention, the optical absorption layer T6 becomes to be raised the temperature thereof, that is individually formed at each part as right above the implanted region 508', and thereby it becomes possible to raise the temperature of the implanted region 508' and then thereby it becomes possible to form an n$^+$ diffusion region 508, with keeping the temperature of the other regions therein to be as lower.

And then after performing the annealing for the Si therein and then there becomes formed the n$^+$ diffusion region 508 in such the above mentioned way, next, by performing a wet etching process with making use of an aqueous solution of a hydrofluoric acid based for example, all of the optical absorption layer T6, which is comprised of Ge, and all of the prevention film layer M65 become to be removed completely therefrom. Furthermore, in a case where the prevention film layer M65 is formed with making use of an AlN film layer, it is able to remove such the prevention film layer M65 with making use of a KOH solution.

And then thereafter, by making use of the PECVD method for example, there becomes to be formed another silicon di-oxide film layer onto all over the rear surface of the substrate 601, which becomes to have a film thickness as approximately 1000 nm. And then thereafter, a photo resist solution becomes to be spin coated onto such the silicon oxide film layer, and then by performing an exposure process and a development process, it becomes able to form the photo resist, which becomes to have an open part at an upper side of the $n^+$ diffusion region 508. And then thereafter, with making use of such the photo resist as a mask, by performing a wet etching process with making use of an aqueous solution of a hydrofluoric acid based for example for such the silicon oxide film layer, it becomes able to form an open part at the silicon oxide film layer for exposing a part of the upper surface of the $n^+$ diffusion region 508.

And then thereafter, by making use of the electron beam evaporation method and then by performing the lift off process for example, it becomes able to form an electrode 510 configured of a Ti/Au layer structure. Furthermore, according to the present embodiment, it is possible to modify in a various manners, as similar to that according to any one of the embodiments as from the first to the fifth regarding the present invention.

Thus, according to the process for producing the semiconductor device regarding the present invention, there becomes to be formed the optical absorption layer, that absorbs the predetermined light to be made use in a period of the annealing process and then becomes to be raised the temperature thereof, onto the impurity implanted region, which is formed at the semiconductor layer, that is comprised of the semiconductor of the III group nitride compound. And then thereby, it becomes possible to raise further efficiently the temperature of the impurity implantation region, which is formed at the semiconductor layer, with keeping the temperature of the other regions therein as lower, that there is not formed any optical absorption layer at all regarding the surface of such the semiconductor layer. As a result, it becomes possible to prevent from there becoming to be occurred the problem, such as that the constitutive atom thereof may become to be segregated out on the surface of the semiconductor layer, that the crystalline defect may become to be formed on the surface of the semiconductor layer, which is called as the pit, or the like. Moreover, as the case may be, it becomes possible to prevent from there becoming to be occurred the further problem as well, such as that the semiconductor layer may become to be cracked, that the partial peeling may become to be happened at between the semiconductor layer and the substrate, or the like. That is to say, it becomes able to realize thereby the process for producing the semiconductor device, wherein it becomes possible to perform the annealing for the impurity to be implanted thereinto, without deteriorating the performance or the reliability of such the device.

What is claimed is:

1. A process for producing a semiconductor device, comprising the steps of:
    forming an optical absorption layer comprised of a substance having a band gap energy smaller than that of a semiconductor of a III group nitride compound on an impurity implanted region of a substrate as a processing object comprising a semiconductor layer comprised of the semiconductor of the III group nitride compound that the impurity implanted region is formed therein, as an optical absorption layer formation process; and
    irradiating predetermined light onto the substrate to anneal the substrate for activating an impurity in the impurity implanted region, said predetermined light having energy smaller than the band gap energy of the semiconductor of the III group nitride compound, as an annealing process.

2. The process for producing the semiconductor device according to claim 1, wherein said optical absorption layer has a band gap energy not higher than the energy of the predetermined light.

3. The process for producing the semiconductor device according to claim 1, wherein said optical absorption layer is formed of a dielectric film layer.

4. The process for producing the semiconductor device according to claim 1, wherein the predetermined light has a wavelength as not shorter than 0.6 μm and not longer than 1.0 μm.

5. The process for producing the semiconductor device according to claim 1, wherein said optical absorption layer has a band gap energy not higher than 1.2 eV.

6. The process for producing the semiconductor device according to claim 1, wherein said optical absorption layer is formed of a film layer formed of one of Ge, DLC, and a-Si.

7. The process for producing the semiconductor device according to claim 1, wherein said semiconductor layer is formed of a layer formed of one of GaN, AlGaN, BGaN, BAlN, InGaN, AlN, and InN.

8. The process for producing the semiconductor device according to claim 1, further comprising the step of forming a prevention film layer for coating an upper surface of the semiconductor layer and the optical absorption layer to prevent nitride atoms in the semiconductor layer from diffusing, as a prevention film layer formation process.

9. The process for producing the semiconductor device according to claim 1, further comprising the step of forming a prevention film layer for coating an upper surface of the semiconductor layer to prevent nitride atoms in the semiconductor layer from diffusing, as a prevention film layer formation process, said optical absorption layer being formed on the prevention film layer.

10. The process for producing the semiconductor device according to claim 1, further comprising the steps of: forming a gate insulator on the semiconductor layer, as a gate insulating film layer formation process; and forming a gate electrode on the gate insulator, as a gate electrode formation process, said impurity implanted region being formed in at least two first regions of the semiconductor layer.

11. The process for producing the semiconductor device according to claim 10, wherein said impurity implantation region is formed in the two first regions and a second region of the semiconductor layer sandwiched between the two first regions and contacting with one of the two first regions.

12. The process for producing the semiconductor device according to claim 10, wherein said semiconductor layer includes a first semiconductor layer formed of the semiconductor of the III group nitride compound and a second semiconductor layer formed on a part of the first semiconductor layer and formed of the semiconductor of the III group nitride compound, said impurity implanted region is formed in a part of the first semiconductor layer where the second semiconductor layer is not formed and a part of the second semiconductor layer, said gate insulator is formed over the first semiconductor layer and the second semiconductor layer, said gate electrode is formed over the gate insulator on the first semiconductor layer and the gate insulating film layer on the second semiconductor layer, and said impurity implanted region in the second semiconductor layer is formed in a region away from a region under the gate electrode.

13. The process for producing the semiconductor device according to claim 10, wherein the semiconductor layer includes a first semiconductor layer formed of the semiconductor of the III group nitride compound, a second semiconductor layer formed on a part on the first semiconductor layer and formed of the semiconductor of the III group nitride compound, and a third semiconductor layer formed on the second semiconductor layer, said impurity implanted region is formed in a part of the first semiconductor layer where the second semiconductor layer is not formed and a part of the third semiconductor layer, said gate insulator is formed over the first semiconductor layer and the third semiconductor layer, said gate electrode is formed over the gate insulating film layer on the first semiconductor layer and the gate insulator on the third semiconductor layer, and said impurity implanted region in the third semiconductor layer is formed at a region away from a region under the gate electrode.

14. The process for producing the semiconductor device according to claim 1, wherein said semiconductor layer includes a mesa structure formed of a lower cladding layer, a lower optical confinement layer, an active layer, an upper optical confinement layer, and an upper part cladding layer, said impurity implanted region being formed in a part of the lower cladding layer and a part of the upper part cladding layer.

15. The process for producing the semiconductor device according to claim 1, wherein the substrate as the processing object includes the semiconductor layer, and a mesa structure formed on a first face of the semiconductor layer and formed of a lower cladding layer, a lower optical confinement layer, an active layer, an upper optical confinement layer, and an upper cladding layer, said impurity implanted region being formed on a second face opposite to the first face, said predetermined light being irradiated on the substrate as from the second face thereof in the annealing process.

* * * * *